(12) United States Patent
Shimura et al.

(10) Patent No.: US 11,996,834 B2
(45) Date of Patent: May 28, 2024

(54) CURRENT BLOCKING ELEMENT ASSEMBLY AND PRODUCT HAVING CURRENT BLOCKING ELEMENT ASSEMBLY

(71) Applicant: MURATA MANUFACTURING CO., LTD., Kyoto (JP)

(72) Inventors: Jusuke Shimura, Kyoto (JP); Kenji Kishimoto, Kyoto (JP); Masahiro Morooka, Kyoto (JP); Keisuke Shimizu, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 289 days.

(21) Appl. No.: 17/713,874

(22) Filed: Apr. 5, 2022

(65) Prior Publication Data

US 2022/0231682 A1 Jul. 21, 2022

Related U.S. Application Data

(60) Division of application No. 16/439,990, filed on Jun. 13, 2019, now Pat. No. 11,309,886, which is a
(Continued)

(30) Foreign Application Priority Data

Dec. 13, 2016 (JP) .................................. 2016-241101

(51) Int. Cl.
*H03K 17/51* (2006.01)
*G01R 22/02* (2006.01)
(Continued)

(52) U.S. Cl.
CPC ............. *H03K 17/51* (2013.01); *G01R 22/02* (2013.01); *G05F 3/26* (2013.01); *H02H 3/08* (2013.01)

(58) Field of Classification Search
CPC ... H01L 21/04; H01L 45/1233; H01L 33/145; H01L 21/28518; H01L 45/1253;
(Continued)

(56) References Cited

U.S. PATENT DOCUMENTS 6,674,103 B2 1/2004 Tu et al.
7,817,692 B2 10/2010 Matsumura et al.
(Continued)

FOREIGN PATENT DOCUMENTS

JP S5479176 U 6/1979
JP S5574240 A 6/1980
(Continued)

OTHER PUBLICATIONS

International Search Report for Application No. PCT/JP2017/033528, dated Nov. 28, 2017.

*Primary Examiner* — Hai L Nguyen
(74) *Attorney, Agent, or Firm* — K&L Gates LLP

(57) ABSTRACT

A current blocking element assembly is provided and includes first and second current blocking elements, first current blocking element including: first-A electrode layer configured to hold ions; first ion conductive layer configured to conduct ions and does not have electronic conductivity; and second-A electrode layer configured to hold ions, first-A electrode layer, first ion conductive layer, and second-A electrode layer laminated in order, second current blocking element including: first-B electrode layer configured to hold ions; second ion conductive layer configured to conduct ions and does not have electronic conductivity; and second-B electrode layer configured to hold ions, first-B electrode layer, second ion conductive layer, and second-B electrode layer laminated in order, wherein the second-A electrode layer and the second-B electrode layer are electrically connected.

7 Claims, 12 Drawing Sheets

Related U.S. Application Data continuation of application No. PCT/JP2017/033528, filed on Sep. 15, 2017.

(51) Int. Cl.
*G05F 3/26* (2006.01)
*H02H 3/08* (2006.01)

(58) Field of Classification Search
CPC ... H01L 21/73; H01L 21/76832; H01S 5/183; H01S 5/18308; H01S 5/18311; H03K 17/51
See application file for complete search history.

(56) References Cited

U.S. PATENT DOCUMENTS

| | | | |
|---|---|---|---|
| 10,673,206 B1 * | 6/2020 | Deppe | H01S 5/2063 |
| 11,309,886 B2 * | 4/2022 | Shimura | H03K 17/51 |
| 2004/0206733 A1 | 10/2004 | Hillebrand et al. | |
| 2013/0082741 A1 | 4/2013 | Domes | |

FOREIGN PATENT DOCUMENTS

| | | |
|---|---|---|
| JP | S6483289 A | 3/1989 |
| JP | 2007157498 A | 6/2007 |
| JP | 2009077634 A | 4/2009 |
| JP | 2012042241 A | 3/2012 |
| JP | 2013081360 A | 5/2013 |

* cited by examiner

CURRENT BLOCKING ELEMENT ASSEMBLY AND PRODUCT HAVING CURRENT BLOCKING ELEMENT ASSEMBLY

CROSS REFERENCE TO RELATED APPLICATIONS

The present application is a divisional application of U.S. patent application Ser. No. 16/439,990 filed on Jun. 13, 2019, now U.S. Pat. No. 11,309,886 B2 issued on Apr. 19, 2022, which is a continuation of PCT patent application no. PCT/JP2017/033528, filed on Sep. 15, 2017, which claims priority to Japanese patent application no. JP2016-241101 filed on Dec. 13, 2016, the entire contents of which are being incorporated herein by reference.

BACKGROUND

The present disclosure generally relates to a current blocking element, a current blocking element assembly, a product having these mounted thereon, and a current controlling method in a product having these mounted thereon.

A current integrating circuit is often used to predict the maintenance time of an electronic apparatus or an electric apparatus (which may hereafter be simply referred to as "electronic apparatus or the like" as a general term) or a lifetime or exchange time of a consumable component, a consumable article, or an exchange component (which may hereafter referred to as "consumable component or the like") mounted on an electronic apparatus or the like.

In the meantime, the current integrating circuit is configured, for example, from a current detection section using electromagnetic coupling such as a clamp meter, an amplification section for amplifying a signal obtained in the current detection section, an A/D conversion circuit section for performing A/D conversion of the amplified signal, a calculation section for integrating the value converted to a digital value, and a storage section for storing the calculation results. However, when such a configuration is adopted, the number of components is large, leading to increase in the costs. Also, when an attempt is made to increase the precision, there is a need to use an A/D conversion circuit section having a high quantization bit number, and this also invites increase in the production costs. Accordingly, such a current integrating circuit is rarely mounted on a consumable component or the like, and is typically mounted on the electronic apparatus or the like.

SUMMARY

Generally, a current integrating circuit for surmising the maintenance time of an electronic apparatus or the like is preferably mounted on the electronic apparatus or the like. On the other hand, a current integrating circuit for surmising the lifetime or exchange time of a consumable component or the like is preferably mounted on the consumable component or the like; however, in view of the production costs, it is difficult to mount the current integrating circuit on the consumable component or the like, so that the current integrating circuit is often mounted on the electronic apparatus or the like. However, when the current integrating circuit is mounted on the electronic apparatus or the like, two inconveniences described below are generated. That is, the first inconvenience is generated when the consumable component or the like is not used up at a time. When the current integrating circuit has a specification such that the integrated value is reset at the time of dismounting or mounting the consumable component or the like, there arises a problem in that, when the consumable component or the like that is in the midway of use is dismounted from the electronic apparatus or the like and mounted again, the history of use of such a consumable component or the like up till then is not reflected. In order to prevent this, there is a need to determine whether the consumable component or the like is in the midway of use or not when the consumable component or the like is exchanged. Also, when the consumable component or the like is in the midway of use, there is a need to obtain the history of use up till then. Further, in order to achieve this, there can be considered, for example, a method of imparting a serial number to each of the consumable components or the like and perform management together with the serial number in the electronic apparatus or the like. However, such a method directly leads to increase in the costs.

The second inconvenience lies in that the risk of use of an unauthorized consumable component or the like is enhanced. There is also a problem in that a current integrating circuit is not mounted on the unauthorized consumable component or the like itself, and the consumable component or the like does not hold information corresponding to the lifetime or exchange time.

Accordingly, an object of the present disclosure is to provide a current blocking element or a current blocking element assembly having a simple structure and configuration and being producible at a low cost, a product having a current blocking element or a current blocking element assembly mounted thereon, and a current controlling method in a product having a current blocking element or a current blocking element assembly mounted thereon.

According to an embodiment of the present technology, a current blocking element is provided. The current blocking element of the present disclosure for achieving the aforementioned object includes:

a first electrode layer configured to hold ions;
an ion conductive layer having ionic conductivity and not having electronic conductivity; and
a second electrode layer configured to hold ions,
the first electrode layer, the ion conductive layer, and the second electrode layer being laminated in this order,
wherein ions held in the first electrode layer are moved to the second electrode layer when current is configured to flow between the first electrode layer and the second electrode layer; and
wherein current flow between the first electrode layer and the second electrode layer is blocked when ions held in one of the first and second electrode layers are depleted or saturated.

Here, when electric current is let to flow from the first electrode layer via the ion conductive layer to the second electrode layer and when the moved ions are cations, the one electrode layer where the cations are depleted is the first electrode layer, and the other electrode layer where the cations are saturated is the second electrode layer. On the other hand, when the moved ions are anions, the one electrode layer where the anions are depleted is the second electrode layer, and the other electrode layer where the anions are saturated is the first electrode layer. Also, when electric current is let to flow from the second electrode layer via the ion conductive layer to the first electrode layer and when the moved ions are cations, the one electrode layer where the cations are depleted is the second electrode layer, and the other electrode layer where the cations are saturated is the first electrode layer. On the other hand, when the moved ions are anions, the one electrode layer where the anions are depleted is the first electrode layer, and the other electrode layer where the anions are saturated is the second electrode layer.

According to an embodiment of the present technology, a current blocking element assembly is provided. The current blocking element assembly of the present disclosure for achieving the aforementioned object includes a first current blocking element and a second current blocking element, the first current blocking element including:
a first-A electrode layer configured to hold ions;
a first ion conductive layer that is configured to conduct ions and does not have electronic conductivity; and
a second-A electrode layer configured to hold ions,
the first-A electrode layer, the first ion conductive layer, and the second-A electrode layer being laminated in this order,
the second current blocking element including:
a first-B electrode layer configured to hold ions;
a second ion conductive layer that is configured to conduct ions and does not have electronic conductivity; and
a second-B electrode layer configured to hold ions,
the first-B electrode layer, the second ion conductive layer, and the second-B electrode layer being laminated in this order,
wherein the second-A electrode layer and the second-B electrode layer are electrically connected;
wherein ions held in one of the electrode layers of the first current blocking element are moved to the other one of the electrode layers of the first current blocking element when current is configured to flow between the first-A electrode layer and the first-B electrode layer; and
wherein current flow between the first-A electrode layer and the second-A electrode layer is blocked when ions held in one of the first-A and second-A electrode layers of the first current blocking element are depleted or saturated.

Here, when electric current is let to flow from the first-A electrode layer via the second-A electrode layer and the second-B electrode layer to the first-B electrode layer and when the moved ions are cations, the one electrode layer where the cations are depleted is the first-A electrode layer or the second-B electrode layer, and the other electrode layer where the cations are saturated is the second-A electrode layer or the first-B electrode layer. On the other hand, when the moved ions are anions, the one electrode layer where the anions are depleted is the second-A electrode layer or the first-B electrode layer, and the other electrode layer where the anions are saturated is the first-A electrode layer or the second-B electrode layer. Also, when electric current is let to flow from the first-B electrode layer via the second-B electrode layer and the second-A electrode layer to the first-A electrode layer and when the moved ions are cations, the one electrode layer where the cations are depleted is the second-A electrode layer or the first-B electrode layer, and the other electrode layer where the cations are saturated is the first-A electrode layer or the second-B electrode layer. On the other hand, when the moved ions are anions, the one electrode layer where the anions are depleted is the first-A electrode layer or the second-B electrode layer, and the other electrode layer where the anions are saturated is the second-A electrode layer or the first-B electrode layer.

According to an embodiment of the present technology, a product having a current blocking element as described herein for achieving the aforementioned object is provided.

According to an embodiment of the present technology, a product having a current blocking element assembly as described herein for achieving the aforementioned object is provided.

According to an embodiment of the present technology, a current controlling method in a product having a current blocking element as described herein for achieving the aforementioned object is provided.

According to an embodiment of the present technology, a current controlling method in a product having a current blocking element assembly as described herein for achieving the aforementioned object is provided.

The current blocking element of the present disclosure and the current blocking element assembly of the present disclosure, or the product having the current blocking element of the present disclosure mounted thereon and the product having the current blocking element assembly of the present disclosure mounted thereon, the current controlling method in the product having the current blocking element of the present disclosure mounted thereon, and the current blocking element or the current blocking element assembly used in the current controlling method in the product having the current blocking element assembly of the present disclosure mounted thereon, are formed by lamination of the first electrode layer, the ion conductive layer, and the second electrode layer in this order, or by connection of two units each formed by lamination of these in this order, and hence have a simple structure and configuration and can be produced at a low cost. Here, the advantageous effects described in the present specification are merely exemplifications and are not limitative, and other suitable properties relating to the present technology may be realized and as further described.

DETAILED DESCRIPTION

Figure 1A:
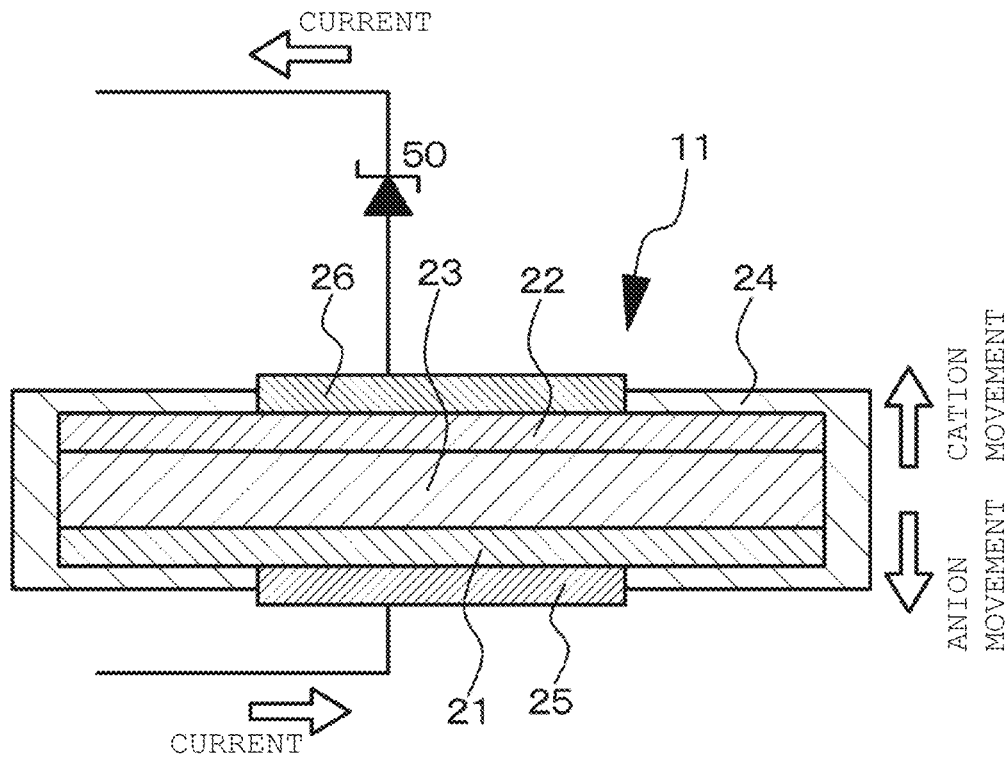
FIGS. 1A and 1B are a schematic sectional view of a current blocking element and a conceptual view of a product having the current blocking element mounted thereon, respectively, according to an embodiment of the present disclosure.

As described herein, the present disclosure will be described based on examples with reference to the drawings, but the present disclosure is not to be considered limited to the examples, and various numerical values and materials in the examples are considered by way of example.

Hereafter, the current blocking element of the present disclosure, the current blocking element in the product having the current blocking element of the present disclosure mounted thereon, and the current blocking element used in the current controlling method in the product having the current blocking element of the present disclosure mounted thereon may be generally referred to as "current blocking element according to the first mode of the present disclosure". Also, the current blocking element constituting the current blocking element assembly of the present disclosure, the current blocking element constituting the current blocking element assembly in the product having the current blocking element assembly of the present disclosure mounted thereon, and the current blocking element constituting the current blocking element assembly used in the current controlling method in the product having the current blocking element of the present disclosure mounted thereon may be generally referred to as "current blocking element according to the second mode of the present disclosure". Further, the phenomenon such that the ions held in an electrode layer are "depleted" refers to the phenomenon in which the ions are in a state of being less than 1% in terms of capacity ratio, and the phenomenon such that the ions held in an electrode layer are "saturated" refers to the phenomenon in which the ions are in a state of being 99% or more in terms of capacity ratio. The same applies to the following descriptions.

In the current blocking elements according to the first to second modes of the present disclosure, the ion conductive layer may include a solid layer. By configuring the ion conductive layer from a solid layer in this manner, there is no fear of generating abnormality in the electrode layer or in the current blocking element even when the ions held in one electrode layer are depleted or the ions held in the other electrode layer are saturated, so that the stability and safety in using the current blocking element or the current blocking element assembly can be ensured, and the current blocking element or the current blocking element assembly can be reduced in scale. Also, problems are hardly generated even when heat is applied to the current blocking element in producing the current blocking element, the current blocking element assembly, or the product.

In each of the current blocking elements according to the first to second modes of the present disclosure including the preferable modes described above, the ions may be lithium ions;

the first electrode layer, or the first-A electrode layer and the first-B electrode layer, may contain at least one kind of a substance selected from the group consisting of metal lithium, a carbon compound, a tin compound, a silicon compound, and lithium titanate ($Li_2TiO_3$);

the second electrode layer, or the second-A electrode layer and the second-B electrode layer, may contain at least one kind of a substance selected from the group consisting of lithium cobaltate ($LiCoO_2$), lithium manganate ($LiMn_2O_4$), and lithium iron phosphate ($LiFePO_4$); and the ion conductive layer, or the ion conductive layer constituting the first current blocking element and the second current blocking element, may include a solid electrolyte layer having lithium ion conductivity (for example, having a hopping conductivity). Depending on the cases, the first electrode layer and the second electrode layer may further contain the materials constituting the solid electrolyte layer, and may still further contain an electroconductive auxiliary agent (graphite-based highly conductive carbon, carbon nanotube-based particles such as represented by VGCF, and metal materials such as Ni, Al, Cu, and stainless steel-based metal).

In the materials constituting the first electrode layer, or the first-A electrode layer and the first-B electrode layer (these may hereafter be generally referred to as "first electrode layer or the like"), specific examples of the carbon compound include natural graphite, artificial graphite, graphite including hard carbon, and cokes; specific examples of the tin compound include tin (Sn), tin oxide ($SnO_x$), lithium tin oxide ($Li_xSnO_y$); and specific examples of the silicon compound include silicon (Si), silicon oxide ($SiO_x$), and lithium silicon oxide ($Li_xSiO_y$). Further, specific examples of the solid electrolyte layer constituting the ion conductive layer include lithium super ion conductor (LISICON), sodium super ion conductor (NASICON) such as LATP and LAGP, beta iron sulfate type ion conductor, $\gamma$-$Li_3PO_4$ type oxygen acid salt (for example, $LiM_2(PO_4)_3$ and LIPON), NASICON type phosphate, perovskite type titanate such as LLT, and thio-LISICON type lithium ion conductor. Alternatively, the solid electrolyte layer constituting the ion conductive layer can be obtained by acid-base reaction of a glass-forming compound (compound capable of being turned into glass alone, specific examples including $SiO_2$, $B_2O_3$, $P_2O_5$, $P_2S_5$, $SiS_2$, $B_2S_3$, $GeS_2$, $Al_2O_3$, $GeO_2$, $La_2O_3$, $Y_2O_3$, $Ta_2O_5$, $Nb_2O_5$, $TiO_2$, $V_2O_5$, $WO_3$, $ZrO_2$, SnO, ZnO, CaO, and BaO) and a modifying compound (compound that is not turned into glass alone but is turned into glass by being combined with a glass-forming compound, specific examples including $LiO_2$, $Li_2S$, $Li_3N$, and $Na_2O$), or may be an oxysulfide-based glass.

Alternatively, the first electrode layer or the like may be configured from carbon doped with lithium (Li) in advance ($C_6Li_x$), and the second electrode layer, or the second-A electrode layer and the second-B electrode layer (these may hereafter be generally referred to as "second electrode layer or the like") may be configured from carbon that does not contain lithium ($C_6$). In other words, the base materials constituting the first electrode layer or the like and the second electrode layer or the like may be the same.

Alternatively, in each of the current blocking elements according to the first to second modes of the present disclosure including the preferable modes described above,
  the ions may be fluoride ions;
  the first electrode layer, or the first-A electrode layer and the first-B electrode layer, may contain a metal fluoride;
  the second electrode layer, or the second-A electrode layer and the second-B electrode layer, may contain a metal fluoride; and
  the ion conductive layer, or the ion conductive layer constituting the first current blocking element and the second current blocking element, may include a solid electrolyte layer having fluoride ion conductivity (for example, see M. A. Reddy and F. Fichtner, "Battery Based on Fluoride Shuttle", Journal of Materials Chemistry 21(43), 2011, 17059-17062.).

Examples of the metal fluoride contained in the first electrode layer or the like include fluoride compounds having a tysonite type structure, specifically, a group of compounds obtained by partially substituting a rare earth fluoride such as lanthanum fluoride ($LaF_3$), cerium fluoride ($CeF_3$), or neodymium fluoride ($NdF_3$), with a divalent fluoride such as calcium fluoride ($CaF_2$), strontium fluoride ($SrF_2$), or barium fluoride ($BaF_2$). Also, specific examples of the metal fluoride contained in the second electrode layer or the like include copper fluoride ($CuF_2$), bismuth fluoride ($BiF_3$), tin fluoride ($SnF_2$), and potassium bismuth fluoride ($KBiF_4$). Further, examples of the solid electrolyte layer constituting the ion conductive layer include fluoride compounds having a tysonite type structure similar to the metal fluoride contained in the first electrode layer or the like, specifically, a group of compounds obtained by partially substituting a rare earth fluoride such as lanthanum fluoride ($LaF_3$), cerium fluoride ($CeF_3$), or neodymium fluoride ($NdF_3$), with a divalent fluoride such as calcium fluoride ($CaF_2$), strontium fluoride ($SrF_2$), or barium fluoride ($BaF_2$).

In each of the current blocking elements of the present disclosure including the preferable modes and configurations described above,
  the first electrode layer may be connected to one terminal of a current copy-side circuit constituting a current mirror circuit or a current proportional circuit, and
  the second electrode layer may be connected to the other terminal of the current copy-side circuit constituting the current mirror circuit or the current proportional circuit.
Further, each of the current blocking elements according to the first mode of the present disclosure including the preferable modes and configurations described above may further include a diode for blocking the current flowing in a direction reverse to that of the current flowing between the first electrode layer and the second electrode layer, whereby the stability and safety in using the current blocking element can be ensured. Specifically, the diode may be, for example, a Zener diode. By this, a reverse voltage exceeding the dielectric breakdown strength of the ion conductive layer, which separates between the first electrode layer and the second electrode layer, can be prevented from being applied to the ion conductive layer with certainty. In other words, a Zener diode that breaks down before reaching this reverse voltage only needs to be connected in series. The same applies hereinafter.

In each of the current blocking element assemblies of the present disclosure including the preferable modes and configurations described above,
  the first-A electrode layer may be connected to one terminal of a current copy-side circuit constituting a current mirror circuit or a current proportional circuit, and
  the first-B electrode layer may be connected to the other terminal of the current copy-side circuit constituting the current mirror circuit or the current proportional circuit.

In each of the products having the current blocking elements of the present disclosure including the preferable modes and configurations described above mounted thereon,
  a current mirror circuit or a current proportional circuit may be further provided;
  a current reference-side circuit constituting the current mirror circuit or the current proportional circuit may be incorporated in the product;
  the first electrode layer may be connected to one terminal of a current copy-side circuit constituting the current mirror circuit or the current proportional circuit, and
  the second electrode layer may be connected to the other terminal of the current copy-side circuit constituting the current mirror circuit or the current proportional circuit.
Further, each of the products having the current blocking elements of the present disclosure including the preferable modes and configurations described above mounted thereon may further include a diode for blocking the current flowing in a direction reverse to that of the current flowing between the first electrode layer and the second electrode layer, whereby the stability and safety in using the current blocking element can be ensured. Specifically, the diode may be, for example, a Zener diode.

In each of the products having the current blocking element assemblies of the present disclosure including the preferable modes and configurations described above mounted thereon,
  a current mirror circuit or a current proportional circuit may be further provided;

a current reference-side circuit constituting the current mirror circuit or the current proportional circuit may be incorporated in the product;

the first-A electrode layer may be connected to one terminal of a current copy-side circuit constituting the current mirror circuit or the current proportional circuit, and the first-B electrode layer may be connected to the other terminal of the current copy-side circuit constituting the current mirror circuit or the current proportional circuit.

In the current blocking element according to the second mode of the present disclosure, the second-A electrode layer and the second-B electrode layer are electrically connected and, as a connection method, for example, the second-A electrode layer and the second-B electrode layer only need to be disposed to oppose each other with a foil, a film, a sheet-shaped material, a plate-shaped material, a layer-shaped material, or the like that is made of an electroconductive material (these may hereafter be generally referred to as "connection layer") interposed therebetween. In other words, the current blocking element assembly only needs to be configured from a lamination structure in which the first-A electrode layer, the ion conductive layer, the second-A electrode layer, the connection layer, the second-B electrode layer, the ion conductive layer, and the first-B electrode layer are laminated. Alternatively, two current blocking elements of the present disclosure may be prepared, and a current blocking element assembly may be fabricated by electrically connecting the second electrode layers with each other with an interconnect wiring or the like.

A storing member for storing the current blocking elements according to the first to second modes of the present disclosure may be specifically, for example, a low-melting-point glass or an epoxy resin, or alternatively, a polymer-based covering material (for example, epoxy-based resin, polycarbonate-based resin, polybutylene terephthalate resin), an inorganic covering material (silicon nitride, $SiO_2$ [one generated from TEOS or the like and molded into a thin film shape]), or a lamination structure of these materials. In order to connect the first electrode layer, first-A electrode layer, first-B electrode layer, and second electrode layer to an external circuit or various circuits provided in the products, a connection layer made of a metal material or an alloy material such as platinum (Pt), silver (Ag), gold (Au), nickel (Ni), tin (Sn), aluminum (Al), copper (Cu), or stainless steel; glass-form carbon; graphite; copper plated with platinum or kovar plated with platinum; Ni plated layer/Sn plated layer or various solder layers, or a connection layer made of a lamination structure of these materials, may be disposed on these electrode layers. Alternatively, the connection layer may be, for example, a sintered product of fine particles made of these metal materials. Here, examples of auxiliary agents (specifically, glass materials that can be sintered) for obtaining the sintered products made of these metal particles include $SiO_2$, $B_2O_3$, $Bi_2O_3$, $V_2O_5$, $P_2O_5$, and $Pb_2O_3$.

The following products can be exemplified as the product having the current blocking element of the present disclosure mounted thereon or the product having the current blocking element assembly of the present disclosure mounted thereon; however, the present disclosure is not limited to these products and can be applied to all types of consumable article business that adopts a so-called Gillette model, producing effects of prompting use of the authorized consumable components.

In a product such as a printer provided with an ink tank or a toner cartridge, an electric current having a correlation with the amount of use of ink or toner is let to flow through the current blocking element of the present disclosure or the current blocking element assembly of the present disclosure (which may hereafter be referred to as "current blocking element or the like of the present disclosure"). The current blocking element or the like of the present disclosure is provided in the ink tank or toner cartridge. When the ink or toner is used up, the current blocking element or the like of the present disclosure is brought into a blocked state and, even when a user loads the ink tank or toner cartridge with an unauthorized ink or toner, the user cannot use the printer, ink tank, or toner cartridge. This can prevent with certainty the unexpected disorder or inconvenience caused by use of the unauthorized ink or toner.

In a product such as a water purifier provided with a filter cartridge, an electric current having a correlation with the amount of water flowing through the water purifier or the period of time of using the water purifier is let to flow through the current blocking element or the like of the present disclosure. The current blocking element or the like of the present disclosure is provided in the filter cartridge. When a predetermined amount of water flows or when a predetermined period of time of using the water purifier passes, the current blocking element or the like of the present disclosure is brought into a blocked state, and the user can no longer use the water purifier or filter cartridge. This can prevent with certainty the unexpected disorder or inconvenience deriving from continuous use of the water purifier or filter cartridge by the user in a state in which a desired effect cannot be obtained.

In a product such as an air purifier provided with a filter, an electric current having a correlation with the amount of air flowing through the air purifier or the period of time of using the air purifier is let to flow through the current blocking element or the like of the present disclosure. The current blocking element or the like of the present disclosure is provided in the filter. When a predetermined amount of air flows or when a predetermined period of time of using the air purifier passes, the current blocking element or the like of the present disclosure is brought into a blocked state, and the user can no longer use the air purifier or filter. This can prevent with certainty the unexpected disorder or inconvenience deriving from continuous use of the air purifier or filter by the user in a state in which a desired effect cannot be obtained.

In a product such as a pack type cleaner provided with a dust collection pack, an electric current having a correlation with the amount of air that the pack type cleaner sucks in or the period of time of using the pack type cleaner is let to flow through the current blocking element or the like of the present disclosure. The current blocking element or the like of the present disclosure is provided in the dust collection pack. When a predetermined amount of air is sucked in or when a predetermined period of time of using the pack type cleaner passes, the current blocking element or the like of the present disclosure is brought into a blocked state, and the user can no longer use the pack type cleaner or dust collection pack. This can prevent with certainty the unexpected disorder or inconvenience deriving from continuous use of the pack type cleaner or dust collection pack by the user in a state in which a desired effect cannot be obtained.

In a product such as an electric tooth brush provided with a replaceable brush part, an electric current having a correlation with the driving current or driving time of the replaceable brush part is let to flow through the current blocking element or the like of the present disclosure. The current blocking element or the like of the present disclosure is provided in the replaceable brush part. When a predetermined amount of driving current flows or when a predetermined driving time passes, the current blocking element or the like of the present disclosure is brought into a blocked state, and the user can no longer use the electric tooth brush or replaceable brush part. This can prevent with certainty the unexpected disorder or inconvenience deriving from continuous use of the electric tooth brush or replaceable brush part by the user in a state in which a desired effect cannot be obtained.

In a product such as an electric shaver provided with a replaceable shaving part, an electric current having a correlation with the driving current or driving time of the replaceable shaving part is let to flow through the current blocking element or the like of the present disclosure. The current blocking element or the like of the present disclosure is provided in the replaceable shaving part.
When a predetermined amount of driving current flows or when a predetermined driving time passes, the current blocking element or the like of the present disclosure is brought into a blocked state, and the user can no longer use the electric shaver or replaceable shaving part. This can prevent with certainty the unexpected disorder or inconvenience deriving from continuous use of the electric shaver or replaceable shaving part by the user in a state in which a desired effect cannot be obtained.

In a product such as a water server provided with a replaceable tank, an electric current having a correlation with the amount of water ejected from the replaceable tank is let to flow through the current blocking element or the like of the present disclosure. The current blocking element or the like of the present disclosure is provided in the replaceable tank. When the water in the replaceable tank is used up, the current blocking element or the like of the present disclosure is brought into a blocked state, and the user can no longer use the water server or replaceable tank. By this, even when the user fills the replaceable tank with tap water or water made by a third party, the user cannot use the water server or replaceable tank, and unexpected disorder or inconvenience caused by use of unauthorized water can be prevented with certainty.

In a product such as a reaper provided with a replaceable blade part, an electric current having a correlation with the driving current or driving time of the replaceable blade part is let to flow through the current blocking element or the like of the present disclosure. The current blocking element or the like of the present disclosure is provided in the replaceable blade part. When a predetermined amount of driving current flows or when a predetermined driving time passes, the current blocking element or the like of the present disclosure is brought into a blocked state, and the user can no longer use the reaper or replaceable blade part. This can prevent with certainty the unexpected disorder or inconvenience deriving from continuous use of the reaper or replaceable blade part by the user in a state in which a desired effect cannot be obtained.

In products such as various vehicles provided with a storage battery, an electric current that accords with the number of charging and discharging times is let to flow through the current blocking element or the like of the present disclosure. The current blocking element or the like of the present disclosure is provided in the storage battery. When charging and discharging are repeated for a prescribed number of times or more, the current blocking element or the like of the present disclosure is brought into a blocked state, and the user can no longer use the various vehicles or storage battery. This can prevent with certainty the unexpected disorder or inconvenience deriving from continuous use of the various vehicles or storage battery by the user in a state in which a desired effect cannot be obtained.

In a product such as a portable game machine or portable media player provided with a replaceable storage battery, an electric current that accords with the number of charging and discharging times is let to flow through the current blocking element or the like of the present disclosure. The current blocking element or the like of the present disclosure is provided in the replaceable storage battery. When charging and discharging are repeated for a prescribed number of times or more, the current blocking element or the like of the present disclosure is brought into a blocked state, and the user can no longer use the portable game machine, portable media player, or the like, or the replaceable storage battery. This can prevent with certainty the unexpected disorder or inconvenience deriving from continuous use of the portable game machine, portable media player, or the like, or the deteriorated replaceable storage battery by the user.

In a product such as an apparatus driven by a dry battery in which liquid leakage is by no means allowable, an electric current that is proportional to the discharging current of the dry battery is let to flow through the current blocking element or the like of the present disclosure. The current blocking element or the like of the present disclosure is provided in the dry battery. By over discharge, gas is generated in the inside of the dry battery to cause rise in the internal pressure of the dry battery, and may invite liquid leakage in some cases. Before such over discharge is reached, that is, when a predetermined amount of electric current flows, the current blocking element or the like of the present disclosure is brought into a blocked state, and the user can no longer use the apparatus. This prevents the over discharge of the dry battery and can prevent the generation of liquid leakage with certainty.

Example 1

Example 1 relates to a current blocking element of the present disclosure, a product having the current blocking element of the present disclosure mounted thereon, and a current controlling method in the product having the current blocking element of the present disclosure mounted thereon.

Referring to the schematic sectional view of FIG. 1A, a current blocking element 11 of Example 1 includes:
a first electrode layer 21 being capable of holding ions as they are, or in a reduced state, or in an oxidized state;
an ion conductive layer 23 having ionic conductivity and not having electronic conductivity; and
a second electrode layer 22 being capable of holding ions as they are, or in a reduced state, or in an oxidized state,
the first electrode layer 21, the ion conductive layer 23, and the second electrode layer 22 being laminated in this order. Further, as current is let to flow between the first electrode layer 21 and the second electrode layer 22, ions held in one of the electrode layers are moved to the other one of the electrode layers; and, when ions held in one of the electrode layers are depleted or ions held in the other one of the electrode layers are saturated, current flow between the first electrode layer 21 and the second electrode layer 22 is blocked. In other words, when an integrated value of the electric current flowing within the current blocking element 11 exceeds a threshold value, the electric current is blocked.

Figure 1B:
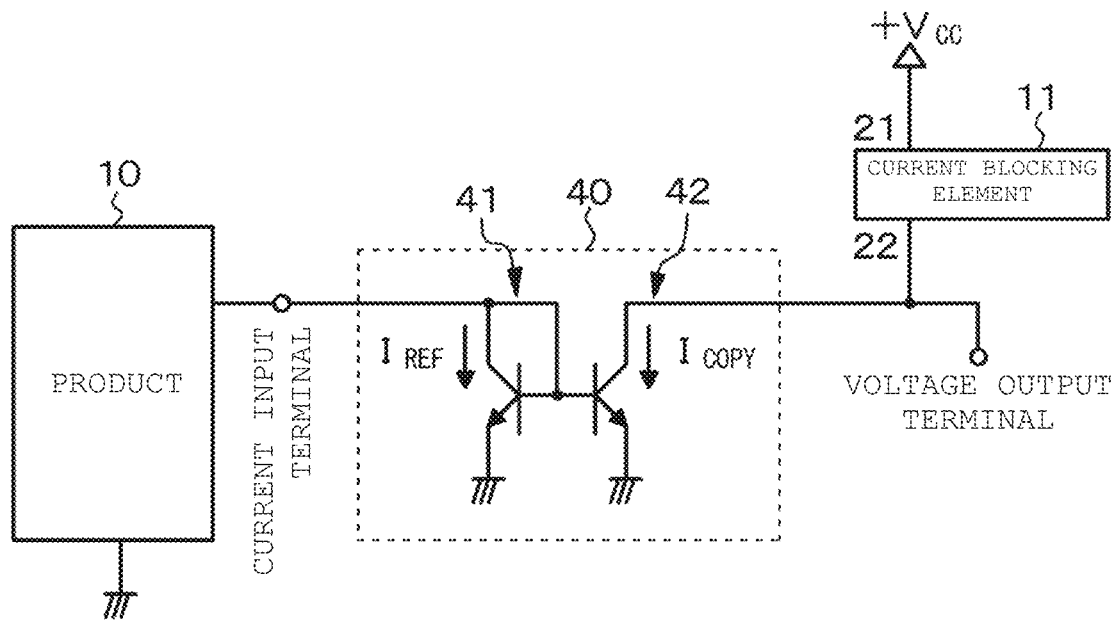

Also, referring to the conceptual view of FIG. 1B, in a product 10 having the current blocking element 11 of Example 1 mounted thereon, as current is let to flow between the first electrode layer 21 and the second electrode layer 22 based on the electric current in the product 10 (electric current flowing in a predetermined region of the product 10), ions held in one of the electrode layers are moved to the other one of the electrode layers; and, when ions held in one of the electrode layers are depleted or ions held in the other one of the electrode layers are saturated, current flow in the product 10 is blocked.

Further, in the current controlling method in the product 10 having the current blocking element 11 of Example 1 mounted thereon, as current is let to flow between the first electrode layer 21 and the second electrode layer 22 based on the electric current in the product 10 (electric current flowing in a predetermined region of the product 10), ions held in one of the electrode layers are moved to the other one of the electrode layers; and, when ions held in one of the electrode layers are depleted or ions held in the other one of the electrode layers are saturated, current flow in the product 10 is blocked.

Here, in Example 1, electric current is let to flow from the first electrode layer 21 via the ion conductive layer 23 to the second electrode layer 22. Therefore, the one electrode layer where the ions are depleted is the first electrode layer 21, and the other electrode layer where the ions are saturated is the second electrode layer 22. However, the present disclosure is not limited to this, so that electric current may be let to flow from the second electrode layer via the ion conductive layer to the first electrode layer and, in this case, the one electrode layer where the ions are depleted is the second electrode layer 22, and the other electrode layer where the ions are saturated is the first electrode layer 21.

In the current blocking element 11 of Example 1, the ion conductive layer 23 includes a solid layer. Further,
the ions are lithium ions;
the first electrode layer 21 contains at least one kind of a substance selected from the group consisting of metal lithium, a carbon compound, a tin compound, and lithium titanate;
the second electrode layer 22 contains at least one kind of a substance selected from the group consisting of lithium cobaltate, lithium manganate, and lithium iron phosphate; and
the ion conductive layer includes a solid electrolyte layer having lithium ion conductivity (for example, having a hopping conductivity).

Specifically, the first electrode layer 21 is made of a carbon compound, more specifically graphite; the second electrode layer 22 is made of lithium cobaltate ($LiCoO_2$); and the ion conductive layer is made of a glass electrolyte containing lithium (Li), boron (B), and silicon (Si). Also, the current blocking element 11 is stored in a storing member 24 made of a low-melting-point glass, epoxy resin, or the like. In order to connect the first electrode layer 21 and the second electrode layer 22 to an external circuit or to the product 10, connecting sections 25, 26 made, for example, of platinum (Pt) and electrically connected to the first electrode layer 21 and the second electrode layer 22 (specifically, formed on the first electrode layer 21 and the second electrode layer 22) are exposed from the storing member 24.

For example, there is typically a correlation of a certain kind (for example, a proportional relationship) between an amount of consumption of a certain kind in the product 10 such as a consumable component, a consumable article, or a replaceable component and an integrated amount of electric current flowing through the product 10. For example, in a product 10 such as a printer provided with an ink tank or toner cartridge, an electric current having correlation to the amount of use of ink or toner is let to flow through the current blocking element 11 of Example 1. Accordingly, a current mirror circuit or current proportional circuit 40 is constructed so that an electric current proportional to the electric current flowing through the product 10 may flow through the current blocking element 11. In other words, in the current blocking element 11 of Example 1,
the first electrode layer 21 is connected to one terminal of a current copy-side circuit 42 constituting the current mirror circuit or current proportional circuit 40, and
the second electrode layer 22 is connected to the other terminal of the current copy-side circuit 42 constituting the current mirror circuit or current proportional circuit 40. Also, the current blocking element 11 of Example 1 is further provided with a diode 50 for blocking the current flowing in a direction reverse to that of the current flowing between the first electrode layer 21 and the second electrode layer 22, specifically a Zener diode connected in series.

Also, in the product 10 having the current blocking element 11 of Example 1 mounted thereon,
a current mirror circuit or current proportional circuit 40 is further provided;
a current reference-side circuit 41 constituting the current mirror circuit or current proportional circuit 40 is incorporated in the product 10;
the first electrode layer 21 is connected to one terminal of a current copy-side circuit 42 constituting the current mirror circuit or current proportional circuit 40; and
the second electrode layer 22 is connected to the other terminal of the current copy-side circuit 42 constituting the current mirror circuit or current proportional circuit 40. Also, the product is further provided with a diode 50 for blocking the current flowing in a direction reverse to that of the current flowing between the first electrode layer 21 and the second electrode layer 22, specifically a Zener diode.

The current blocking element 11 of Example 1 can be fabricated, for example, by the following method.

In fabricating the ion conductive layer 23, a powder of glass electrolyte having a composition with a molar fraction of
$Li_2O:B_2O_3:SiO_2=54:11:35$
was prepared. Further, 16 gram of a butyl acetate dispersion liquid to which 10 gram of the powder of glass electrolyte and 10 mass % of an acrylic binder had been added, 1.6 gram of bis(2-ethylhexyl) phthalate as a plasticizer, and 15 gram of butyl acetate as an additional solvent were mixed to obtain an electrolyte slurry. Further, this electrolyte slurry was applied onto a polyethylene terephthalate (PET) base material to a predetermined thickness with use of a bar coater. Subsequently, on the coated film after application, removal of the solvent was carried out for about one hour with use of a drying furnace heated to 80° C. Thus, a green sheet of glass electrolyte was obtained.

In fabricating the first electrode layer 21, the following materials were weighed and stirred, so as to prepare a slurry for the first electrode layer. Here, a glass binder material is made of the above $Li_2O/B_2O_3/SiO_2$. Also, in fabricating the second electrode layer 22, the following materials were weighed and stirred, so as to prepare a slurry for the second electrode layer.

<Slurry for the First Electrode Layer>
graphite: 3.00 gram
glass binder material: 3.00 gram
thickening agent made of an acrylic binder: 1.07 gram
solvent made of terpineol: 6.25 gram <Slurry for the Second Electrode Layer>
$LiCoO_2$: 3.00 gram
glass binder material: 3.00 gram
thickening agent made of an acrylic binder: 1.07 gram
solvent made of terpineol: 6.25 gram Further, the slurry for the first electrode layer was applied onto one surface of the green sheet of glass electrolyte on the basis of the screen printing method, and the slurry for the second electrode layer was applied onto the other surface on the basis of the screen printing method. Alternatively, the slurry for the first electrode layer may be applied onto a PET base material to a predetermined thickness with use of a bar coater and dried to obtain a green sheet for the first electrode layer, and the slurry for the second electrode layer may be applied onto a PET base material to a predetermined thickness with use of a bar coater and dried to obtain a green sheet for the second electrode layer. Further, the green sheet for the first electrode layer, the green sheet of glass electrolyte, and the green sheet for the second electrode layer may be superposed. Further, for example, after the resultant was left to stand quietly for about 10 hours in a firing furnace heated to 320° C. to remove the organic substances such as the binder and the plasticizer, the resultant was fired for 10 minutes at a temperature of 400° C. to 420° C., so as to soften and sinter the electrolyte. Subsequently, on the basis of the sputtering method, a connecting section 25 made of a platinum (Pt) layer was formed on the first electrode layer 21 and, on the basis of the sputtering method, a connecting section 26 made of a platinum (Pt) layer was formed on the second electrode layer 22. Thus, the current blocking element 11 of Example 1 was obtained. Further, the obtained current blocking element 11 was stored into the storing member 24.

Before starting use of the current blocking element 11 (initial state), the first electrode layer 21 is in a state in which ions are held, and the second electrode layer 22 is in a state in which ions are not held (or, depending on the cases, a state in which ions are held a little or to a certain extent by the second electrode layer 22). Here, the first electrode layer 21 may hold ions in a saturated state or may hold ions in an unsaturated state. The second electrode layer 22 may be in a state in which ions are depleted or in a state in which the ions are held and not depleted. In a lithium ion type all solid secondary battery, this is what may be called a charged state in which lithium is contained in a negative electrode corresponding to the first electrode layer 21, and the value of x is larger than 0 when, for example, the content is expressed as $C_6Li_x$. Specifically, for example, in $Li_yCoO_2$ constituting the second electrode layer 22, Li is in a state of being deficient (the value of y is less than 1), and the deficient amount of Li is in a state of being present between graphite layers constituting the first electrode layer 21. By controlling the saturated state of ions before the start of use (initial state), a threshold value of the current flowing within the current blocking element 11 can be controlled. Here, when the integrated value of the current flowing within the current blocking element 11 exceeds the threshold value, the current flowing in the current blocking element 11 is automatically blocked.

Assuming that the one electrode layer in which ions are depleted is the first electrode layer 21 and that the other electrode layer in which ions are saturated is the second electrode layer 22, it is sufficient to let the electric current flow from the second electrode layer 22 via the ion conductive layer 23 to the first electrode layer 21 and let the first electrode layer 21 hold the ions in order to obtain the aforementioned initial state. This operation corresponds to charging in a lithium ion type all solid secondary battery. Depending on the cases, the first electrode layer 21 in which ions are held in a saturated state or in an unsaturated state and the second electrode layer 22 in which ions are depleted or held in an unsaturated state may be prepared in advance, and the current blocking element 11 may be produced by using these electrode layers.

Further, during the operation of the current blocking element 11, electric current is let to flow from the first electrode layer 21 via the ion conductive layer 23 to the second electrode layer 22. In other words, an electric current that is, for example, proportional to the state of use of the product 10 such as a consumable component is let to flow from the first electrode layer 21 via the ion conductive layer 23 to the second electrode layer 22. This operation moves the lithium ions from the first electrode layer 21 via the ion conductive layer 23 to the second electrode layer 22. Such a state is similar to a discharged state in a lithium ion type all solid secondary battery. In a conventional lithium ion type all solid secondary battery, the electric current needs to be stopped before an overly discharged state is attained. However, in the current blocking element 11 of Example 1, use can be continued until after the overly discharged state is attained, unlike the conventional lithium ion type all solid secondary battery.

Figure 2:
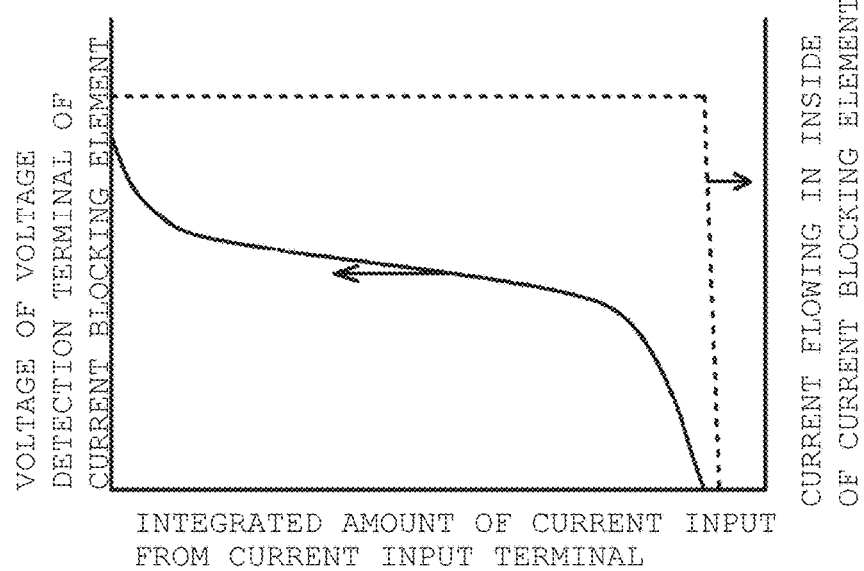
FIG. 2 is a view schematically showing a relationship between an integrated amount of input current and output voltage in a current blocking element and a view schematically showing the value of current flowing in the inside of the current blocking element according to an embodiment of the present disclosure.

Further, when the ions held in one electrode layer (specifically, the first electrode layer 21) are depleted or when the ions held in the other electrode layer (specifically, the second electrode layer 22) are saturated, that is, when the lithium ions can no longer be moved from the first electrode layer 21 via the ion conductive layer 23 to the second electrode layer 22 (when a completely discharged state with the voltage being 0 is attained, as stated in terms of a conventional lithium ion type all solid secondary battery), or in still other words, when the integrated value of the current flowing within the current blocking element 11 exceeds the threshold value, the lithium ions serving as a carrier of electric charge are no longer present. As a result of this, the electric current can no longer be let to flow in the current blocking element 11, whereby an insulated state is attained, or alternatively, the internal resistance of the current blocking element 11 rises suddenly and rapidly, and the electric current is automatically blocked. However, as described above, the phenomenon such that the ions held in an electrode layer are "depleted" refers to the phenomenon in which the ions are in a state of being less than 1% in terms of capacity ratio, and the phenomenon such that the ions held in an electrode layer are "saturated" refers to the phenomenon in which the ions are in a state of being 99% or more in terms of capacity ratio. Accordingly, widely speaking, when an almost completely discharged state with the voltage (potential difference) being almost 0 is attained (for example, when the voltage (potential difference) comes to be about 1.2 volt or less in a current blocking element 11 having a structure similar to that of an LCO/graphite-based lithium ion battery having a practical-use voltage range of about 3 volt to 4.3 volt), the electric current can no longer be let to flow in the current blocking element 11, whereby an insulated state is attained, or alternatively, the internal resistance of the current blocking element 11 rises suddenly and rapidly, and the electric current is automatically blocked. Here, FIG. 2 schematically shows a relationship between the integrated amount of electric current that is input from the current input terminal shown in FIG. 1B and the voltage output from the voltage output terminal that outputs the voltage from the current blocking element 11. In FIG. 2, the solid line shows this relationship. Also, the dotted line schematically shows the value of electric current flowing in the inside of the current blocking element 11.

In order to detect the insulated state or the sudden and rapid rise in the internal resistance of the current blocking element 11, it is sufficient that, for example, one comparator circuit is present. Further, the electric current flowing in the product 10 is blocked on the basis of an output from the comparator circuit. Such a configuration can be constructed at an outstandingly lower cost and in a more convenient manner than a conventional current integrating circuit that needs an amplifier section, an A/D conversion circuit section, an operation section, a storage section, and the like. Accordingly, the current blocking element 11 can be mounted on a consumable component or the like.

Here, in the above description, comparison with the operation of a lithium ion type all solid secondary battery has been made; however, the current blocking element 11 of the present disclosure is not an energy device (secondary battery) but is inherently a current blocking element (current integrating element). For this reason, there is no need to generate an electromotive force between the first electrode layer 21 and the second electrode layer 22. Accordingly, the first electrode layer 21 may be configured from carbon doped with lithium (Li) in advance ($C_6Li_x$), and the second electrode layer 22 may be configured from carbon ($C_6$) that does not contain lithium. In other words, the base materials constituting the first electrode layer 21 and the second electrode layer 22 may be the same. Also, since the current blocking element 11 of the present disclosure is not used as an energy device (secondary battery), the cycle characteristics can be ignored as well. Here, since the ion conductive layer 23 is made of a solid layer, the current blocking element 11 can be continuously used safely and stably until the ions held in one electrode layer (specifically, the first electrode layer 21) are depleted or the ions held in the other electrode layer (specifically, the second electrode layer 22) are saturated.

As described above, the configuration and structure of the current blocking element 11 of Example 1 are similar to the configuration and structure of a lithium ion type all solid secondary battery. However, unlike the conventional lithium ion type all solid secondary battery, the current blocking element 11 of Example 1 operates, as it were, as an over discharge preventing circuit. In a lithium ion type all solid secondary battery, an operation such as maintaining a discharged state until the electrolyte layer separating between the negative electrode and the positive electrode exceeds the dielectric breakdown strength, is not adopted. However, in the current blocking element 11 of Example 1, an operation such as letting the electric current flow from the first electrode layer 21 via the ion conductive layer 23 to the second electrode layer 22 until the ions held in one electrode layer (specifically, the first electrode layer 21) are depleted or the ions held in the other electrode layer (specifically, the second electrode layer 22) are saturated, that is, until the integrated value of electric current flowing within the current blocking element 11 exceeds the threshold value, is continued within a range such that the ion conductive layer 23 separating between the first electrode layer 21 and the second electrode layer 22 does not exceed the dielectric breakdown strength. Here, when the ions held in one electrode layer are depleted or when the ions held in the other electrode layer are saturated, that is, when the integrated value of electric current flowing within the current blocking element 11 exceeds the threshold value, the flow of electric current from the first electrode layer 21 via the ion conductive layer 23 to the second electrode layer 22 is blocked. In this manner, the current blocking element 11 of Example 1 is a current blocking element of current integrated value sensitive type.

Further, by making most of the characteristics such that the current blocking element 11 of the present disclosure has a higher energy density and a smaller amount of self-discharging than a conventional capacitor and hence has a capability of measuring the integrated value of electric current at a high precision, the configuration and structure similar to those of a lithium ion type all solid secondary battery are used not as an energy device but as a current blocking element (current integrating element). Further, since the current blocking element 11 captures the phenomenon such that the ions held in one electrode layer are depleted or the phenomenon such that the ions held in the other electrode layer are saturated, and does not capture a phenomenon such that the ions held in one electrode layer come close to being depleted or a phenomenon such that the ions held in the other electrode layer come close to being saturated, stable operation of the current blocking element can be ensured. Also, the temperature dependency of the operation of the current blocking element is small.

Further, since the current blocking element is formed by lamination of the first electrode layer, the ion conductive layer, and the second electrode layer in this order, the current blocking element has a simple structure and configuration and hence can be produced at a low cost. Accordingly, the current blocking element can be mounted on a consumable component or the like. As a result, information corresponding to the lifetime or the time of replacement of the consumable component or the like can be held by the consumable component or the like itself, whereby inconvenience generated when the consumable component or the like is not used up at a time or inconvenience such that the risk of use of an unauthorized consumable component or the like is enhanced, can be eliminated. Also, a current integrating circuit (what is known as a coulomb counter) for inferring the maintenance time of a product or an electronic apparatus including the product can be configured from the current blocking element and can be made simpler and produced at a lower cost than a conventional circuit having a current detection section, an amplifier section, an A/D conversion circuit section, an operation section, and a storage section.

Moreover, problems are hardly generated even when heat is applied to the current blocking element in producing the current blocking element or the product. Specifically, for example, in producing the product, there is no fear of damage even when heat is applied to the current blocking element in, for example, a solder reflow step.

Specifically, when the ink or toner is used up, the current blocking element of Example 1 is brought into a blocked state and, even when a user loads the ink tank or toner cartridge with an unauthorized ink or toner, the user cannot use the printer which is the product, because the ink tank or toner cartridge does not operate. This can prevent with certainty the unexpected disorder or inconvenience caused by use of the unauthorized ink or toner.

Figure 3:
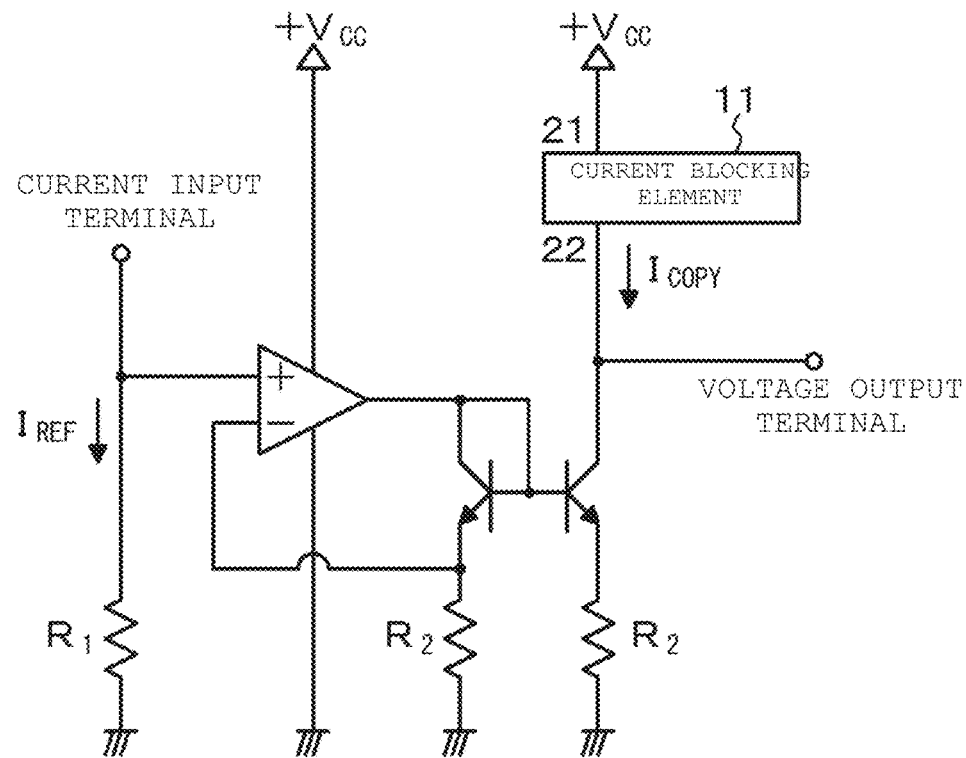
FIG. 3 is an applied circuit diagram of a current mirror circuit.

FIG. 3 shows an applied circuit diagram of a current mirror circuit (current proportional circuit), where an electric current proportional to the current $I_{REF}$ is let to flow as an electric current $I_{COPY}$. Specifically, when $R_1$ is equal to $R_2$, a current mirror operation is carried out, whereas when $R_1$ is not equal to $R_2$, a current proportional operation is carried out, and the value of electric current $I_{COPY}$ at that time is $I_{COPY}=(R_1/R_2)I_{REF}$. This current proportional circuit can be used by substituting for the current mirror circuits in FIGS. 1B and 4B. Here, the minus side of the circuit part in the product 10 that is to be connected to the current blocking element 11 is connected to the current input terminal. Assuming that the electric current flowing from the current input terminal to the grounded part is $I_{REF}$, the current $I_{COPY}$ flowing in the current blocking element 11 is, when $I_{REF} \geq 0$, $$I_{COPY} = (R_1/R_2) \times I_{REF} \quad (1)$$

In other words, by using this applied circuit of the current mirror circuit (current proportional circuit), the electric current $I_{COPY}$ that is proportional to the load current $I_{REF}$ can be let to flow through the current blocking element 11. When a resistor having a small resistance is used as $R_1$ and a resistor having a large resistance is used as $R_2$, the current blocking element 11 can be reduced in scale. Here, when $I_{REF} < 0$, then $I_{COPY} = 0$, and electric current does not flow in the current blocking element 11. Accordingly, even when electric current is drawn out from the current input terminal, the integrated value of electric current within the current blocking element 11 cannot be decreased.

When the current blocking element 11 is in a conduction state and the internal impedance thereof is sufficiently lower than $R_2$, the voltage appearing at the voltage output terminal is approximately equal to $+V_{cc}$. Also, when the current blocking element 11 is in a blocked state and the internal impedance thereof is sufficiently higher than $R_2$, the voltage appearing at the voltage output terminal is approximately equal to 0 volt. In other words, by detecting the voltage appearing at the voltage output terminal, it is readily possible to detect whether the current blocking element 11 is in a conduction state or in a blocked state.

Example 2

Example 2 relates to a current blocking element assembly of the present disclosure, a product having the current blocking element assembly of the present disclosure mounted thereon, and a current controlling method in the product having the current blocking element assembly of the present disclosure mounted thereon.

Figure 4A:
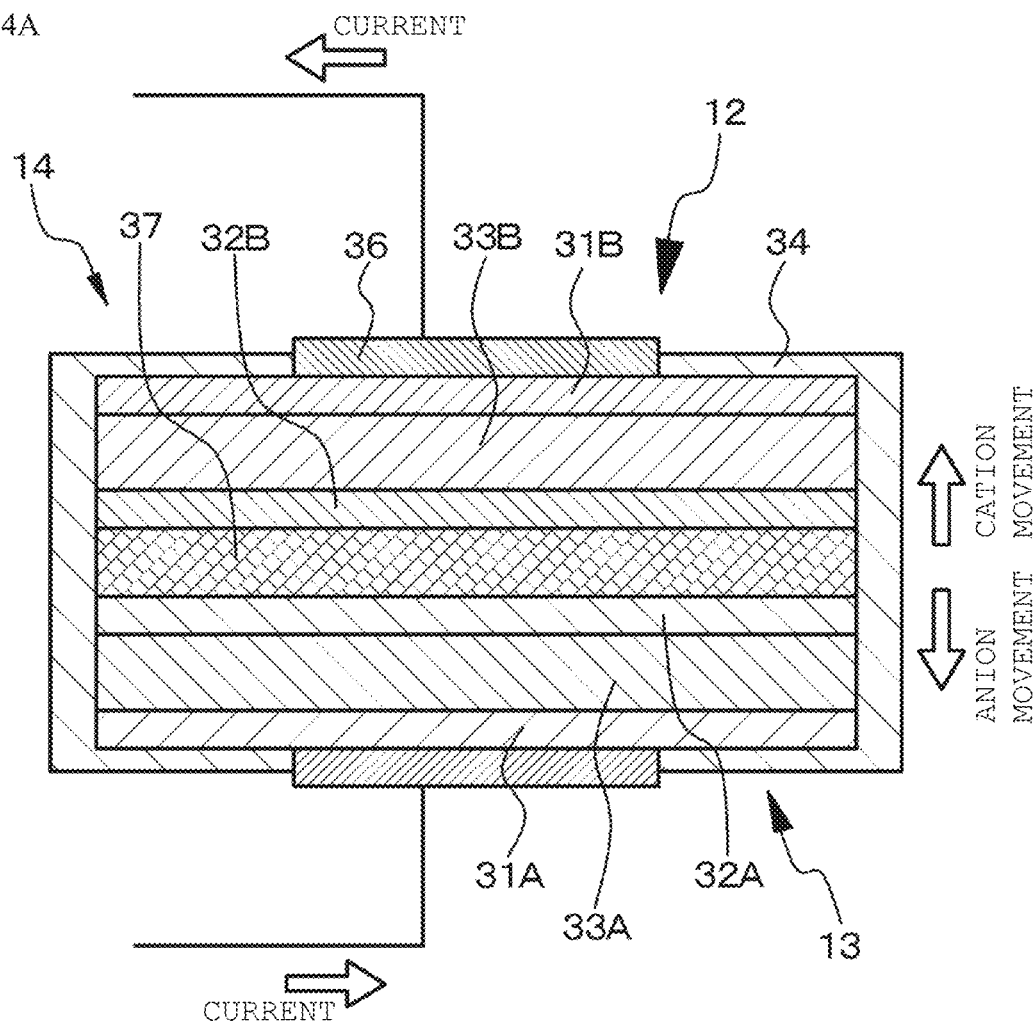
FIGS. 4A and 4B are a schematic sectional view of a current blocking element assembly and a conceptual view of a product having the current blocking element assembly mounted thereon, respectively, according to an embodiment of the present disclosure.

Referring to the schematic sectional view of FIG. 4A, a current blocking element assembly 12 of Example 2 includes a first current blocking element 13 and a second current blocking element 14,
  the first current blocking element 13 including:
  a first-A electrode layer 31A being capable of holding ions as they are, or in a reduced state, or in an oxidized state;
  an ion conductive layer 33A that conducts ions and does not have electronic conductivity; and
  a second-A electrode layer 32A being capable of holding ions as they are, or in a reduced state, or in an oxidized state,
  the first-A electrode layer 31A, the ion conductive layer 33A, and the second-A electrode layer 32A being laminated in this order,
  the second current blocking element 14 including:
  a first-B electrode layer 31B being capable of holding ions as they are, or in a reduced state, or in an oxidized state;
  an ion conductive layer 33B that conducts ions and does not have electronic conductivity; and
  a second-B electrode layer 32B being capable of holding ions as they are, or in a reduced state, or in an oxidized state,
  the first-B electrode layer 31B, the ion conductive layer 33B, and the second-B electrode layer 32B being laminated in this order.

Further, the second-A electrode layer 32A and the second-B electrode layer 32B are electrically connected (specifically, in Example 2, the second-A electrode layer 32A and the second-B electrode layer 32B are electrically connected via a connection layer 37) and, as current is let to flow between the first-A electrode layer 31A and the first-B electrode layer 31B, ions held in one of the electrode layers constituting the first current blocking element 13 are moved to other one of the electrode layers constituting the first current blocking element 13; and, when ions held in one of the electrode layers constituting the first current blocking element 13 are depleted or ions held in other one of the electrode layers constituting the first current blocking element 13 are saturated, current flow between the first-A electrode layer 31A and the second-A electrode layer 32A is blocked. Alternatively, ions held in one of the electrode layers constituting the second current blocking element 14 are moved to other one of the electrode layers constituting the second current blocking element 14; and, when ions held in one of the electrode layers constituting the second current blocking element 14 are depleted or ions held in other one of the electrode layers constituting the second current blocking element 14 are saturated, current flow between the first-B electrode layer 31B and the second-B electrode layer 32B is blocked.

Figure 4B:
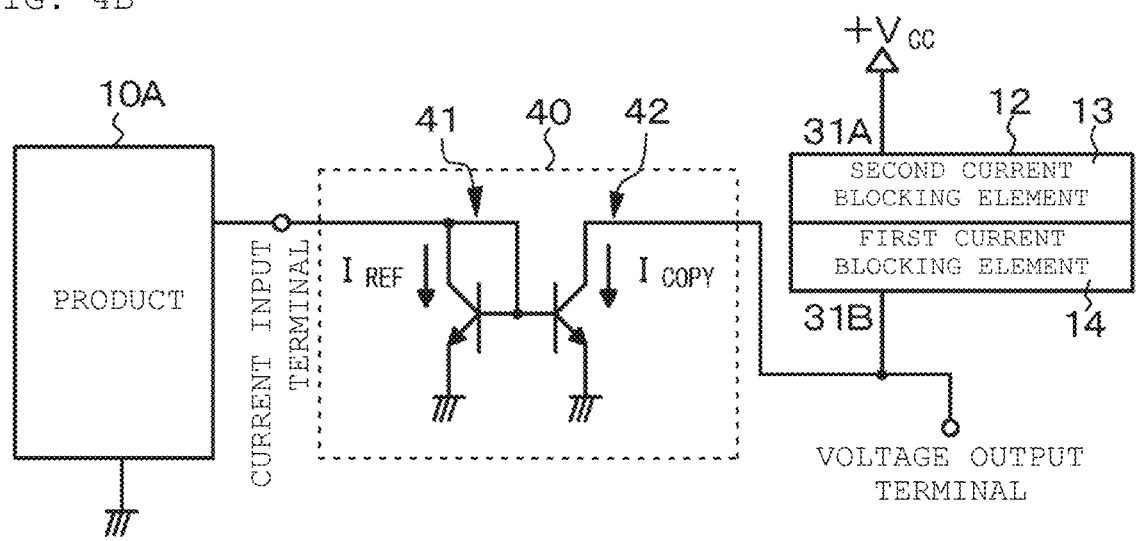

Also, referring to the conceptual view of FIG. 4B, in a product 10A having the current blocking element assembly 12 of Example 2 mounted thereon, as current is let to flow between the first-A electrode layer 31A and the first-B electrode layer 31B based on a current in the product 10A (current flowing in a predetermined region of the product 10A), ions held in one of the electrode layers constituting the first current blocking element 13 are moved to other one of the electrode layers constituting the first current blocking element 13; and, when ions held in one of the electrode layers constituting the first current blocking element 13 are depleted or ions held in other one of the electrode layers constituting the first current blocking element 13 are saturated, current flow in the product 10A is blocked. Alternatively, ions held in one of the electrode layers constituting the second current blocking element 14 are moved to other one of the electrode layers constituting the second current blocking element 14; and, when ions held in one of the electrode layers constituting the second current blocking element 14 are depleted or ions held in other one of the electrode layers constituting the second current blocking element 14 are saturated, current flow in the product 10A is blocked.

Also, a current controlling method in the product 10A having the current blocking element assembly 12 of Example 2 mounted thereon is such that, as current is let to flow between the first-A electrode layer 31A and the first-B electrode layer 31B based on a current in the product 10A (current flowing in a predetermined region of the product 10A), ions held in one of the electrode layers constituting the first current blocking element 13 are moved to other one of the electrode layers constituting the first current blocking element 13; and, when ions held in one of the electrode layers constituting the first current blocking element 13 are depleted or ions held in other one of the electrode layers constituting the first current blocking element 13 are saturated, current flow in the product 10A is blocked. Alternatively, ions held in one of the electrode layers constituting the second current blocking element 14 are moved to other one of the electrode layers constituting the second current blocking element 14; and, when ions held in one of the electrode layers constituting the second current blocking element 14 are depleted or ions held in other one of the electrode layers constituting the second current blocking element 14 are saturated, current flow in the product 10A is blocked.

In Example 2, it is assumed that the electric current is let to flow from the first-A electrode layer 31A via the second-A electrode layer 32A and the second-B electrode layer 32B to the first-B electrode layer 31B. Therefore, when the moved ions are cations, the one electrode layer where the ions are depleted is the first-A electrode layer 31A or the second-B electrode layer 32B, and the other electrode layer where the ions are saturated is the second-A electrode layer 32A or the first-B electrode layer 31B. On the other hand, when the moved ions are anions, the one electrode layer where the ions are depleted is the second-A electrode layer 32A or the first-B electrode layer 32B, and the other electrode layer where the ions are saturated is the first-A electrode layer 31A or the second-B electrode layer 32B. However, the present disclosure is not limited to this alone, so that, when the electric current is let to flow from the first-B electrode layer 31B via the second-B electrode layer 32B and the second-A electrode layer 32A to the first-A electrode layer 31A and when the moved ions are cations, the one electrode layer where the ions are depleted is the first-B electrode layer 31B or the second-A electrode layer 32A, and the other electrode layer where the ions are saturated is the second-B electrode layer 32B or the first-A electrode layer 31A. On the other hand, when the moved ions are anions, the one electrode layer where the ions are depleted is the second-B electrode layer 32B or the first-A electrode layer 31A, and the other electrode layer where the ions are saturated is the first-B electrode layer 32B or the second-A electrode layer 32A.

The second-A electrode layer 32A and the second-B electrode layer 32B are electrically connected, and specifically, the second-A electrode layer 32A and the second-B electrode layer 32B are disposed to oppose each other with a connection layer 37, which is made of platinum (Pt), stainless steel, glass-form carbon, copper plated with platinum, kovar plated with platinum, or the like, interposed therebetween. In other words, the current blocking element assembly 12 is configured from a lamination structure in which the first-A electrode layer 31A, the ion conductive layer 33A, the second-A electrode layer 32A, the connection layer 37, the second-B electrode layer 32B, the ion conductive layer 33B, and the first-B electrode layer 31B are laminated.

In the current blocking element assembly 12 of Example 2 as well, the ion conductive layers 33A, 33B include a solid layer. Further,
  the ions are lithium ions;
  the first-A electrode layer 31A and the first-B electrode layer 31B contain at least one kind of a substance selected from the group consisting of metal lithium, a carbon compound, a tin compound, a silicon compound, and lithium titanate;
  the second-A electrode layer 32A and the second-B electrode layer 32B contain at least one kind of a substance selected from the group consisting of lithium cobaltate, lithium manganate, and lithium iron phosphate; and
  the ion conductive layers 33A, 33B include a solid electrolyte layer having lithium ion conductivity (for example, having a hopping conductivity).

Specifically, the first-A electrode layer 31A and the first-B electrode layer 31B are made of the same material as the first electrode layer 21 in Example 1; the second-A electrode layer 32A and the second-B electrode layer 32B are made of the same material as the second electrode layer 22 in Example 1; and the ion conductive layers 33A, 33B are made of the same material as the ion conductive layer 23 in Example 1. Further, the current blocking element assembly 12 is stored in a storing member 34 similar to that of Example 1. In order to connect the first-A electrode layer 31A and the first-B electrode layer 31B to an external circuit or to the product 10A, connecting sections 35, 36 made, for example, of platinum (Pt) and electrically connected to the first-A electrode layer 31A and the first-B electrode layer 31B (specifically, formed on the first-A electrode layer 31A and the first-B electrode layer 31B) are exposed from the storing member 34. Here, the connecting sections 35, 36 may be used as terminals for setting an initial state. Also, a third terminal section 38 connected to the connection layer 37 for setting an initial state may be provided (See FIG. 6 mentioned later).

For example, there is typically a correlation of a certain kind (for example, a proportional relationship) between an amount of consumption of a certain kind in a consumable component, a consumable article, or a replaceable component and an integrated amount of electric current flowing through the product 10A. For example, in a product 10A such as a printer provided with an ink tank or toner cartridge, an electric current having correlation to the amount of use of ink or toner is let to flow through the current blocking element assembly 12 of Example 2. Accordingly, a current mirror circuit or current proportional circuit 40 is constructed so that an electric current proportional to the electric current flowing through the product 10A may flow through the current blocking element assembly 12. In other words, in the current blocking element assembly 12 of Example 2,
  the first-A electrode layer 31A is connected to one terminal of a current copy-side circuit 42 constituting the current mirror circuit or current proportional circuit 40, and
  the first-B electrode layer 31B is connected to the other terminal of the current copy-side circuit 42 constituting the current mirror circuit or current proportional circuit 40.

Also, in the product 10A having the current blocking element assembly 12 of Example 2 mounted thereon,
  a current mirror circuit or current proportional circuit 40 is further provided;
  a current reference-side circuit 41 constituting the current mirror circuit or current proportional circuit 40 is incorporated in the product 10A;
  the first-A electrode layer 31A is connected to one terminal of a current copy-side circuit 42 constituting the current mirror circuit or current proportional circuit 40; and
  the first-B electrode layer 31B is connected to the other terminal of the current copy-side circuit 42 constituting the current mirror circuit or current proportional circuit 40.

The current blocking element assembly 12 of Example 2 can be fabricated by a method substantially similar to the method of fabricating the current blocking element 11 described in Example 1, so that the detailed description thereof will be omitted. Also, the operation of the first current blocking element 13 in the current blocking element assembly 12 of Example 2 is substantially the same as the operation of the current blocking element 11 described in Example 1, so that the detailed description thereof will be omitted.

Before starting use of the current blocking element assembly 12 (initial state), the first-A electrode layer 31A and the first-B electrode layer 31B are in a state in which ions are held, and the second-A electrode layer 32A and the second-B electrode layer 32B are in a state in which ions are not held. Here, the first-A electrode layer 31A and the first-B electrode layer 31B may hold ions in a saturated state or may hold ions in an unsaturated state. The second-A electrode layer 32A and the second-B electrode layer 32B may be in a state in which ions are depleted or in a state in which the ions are held in an unsaturated state.

When electric current is let to flow from the first-A electrode layer 31A via the second-A electrode layer 32A and the second-B electrode layer 32B to the first-B electrode layer 31B, the ions held in the first-A electrode layer 31A decrease in amount; the ions held in the second-A electrode layer 32A increase in amount; the ions held in the second-B electrode layer 32B decrease in amount; and the ions held in the first-B electrode layer 31B increase in amount. Further, eventually, the ions come to be depleted in the first-A electrode layer 31A, or else the ions come to be saturated in the second-A electrode layer 32A.

In the meantime, in the current blocking element assembly 12 of Example 2, the first current blocking element 13 and the second current blocking element 14 are disposed symmetrically via the connection layer 37. Accordingly, the functions of the first current blocking element 13 and the second current blocking element 14 will be reversed if, after the electric current flowing through the product 10A is blocked by the operation of the first current blocking element 13, a change-over switch is provided so that the electric current may flow from the first-B electrode layer 31B via the second-B electrode layer 32B and the second-A electrode layer 32A to the first-A electrode layer 31A. In the second current blocking element 14, the one electrode layer where the ions are depleted is the first-B electrode layer 31B; the other electrode layer where the ions are saturated is the second-B electrode layer 32B; and the electric current flowing through the product 10A is blocked by the operation of the second current blocking element 14.

In other words, in the second current blocking element 14, movement of ions from the first-B electrode layer 31B via the ion conductive layer 33B to the second-A electrode layer 32A is started. Further, the ions held in the first-B electrode layer 31B decrease in amount; the ions held in the second-B electrode layer 32B increase in amount; the ions held in the second-A electrode layer 32A decrease in amount; and the ions held in the first-A electrode layer 31A increase in amount. Further, eventually, the ions come to be depleted in the first-B electrode layer 31B, or else the ions come to be saturated in the second-B electrode layer 32B.

Thus, in Example 2, there can be provided a current blocking element assembly 12 capable of being used repeatedly for any number of times while inverting the electric current, in the same manner as a sand clock capable of being used repeatedly for any number of times by being turned upside down. By controlling the saturated state of ions before the start of use (initial state), the threshold value of the electric current flowing within the current blocking element assembly 12 can be controlled. In other words, the initial ion-holding state in the first current blocking element 13 and the second current blocking element 14 can be set by using the connection sections 35, 36 and the third terminal section 38 shown in FIG. 6 described later as terminals for setting an initial state and letting a suitable electric current flow between the connection section 35 and the third terminal section 38 and between the connection section 36 and the third terminal section 38. Also, since the first current blocking element 13 and the second current blocking element 14 are symmetrically disposed via the connection layer 37, the electromotive forces that can possibly be generated in the first current blocking element 13 and the second current blocking element 14 can be cancelled with each other, so that the current blocking element assembly 12 can be treated as a simple switching element constituted of two states which are a conduction state and an insulation state.

Figure 5:
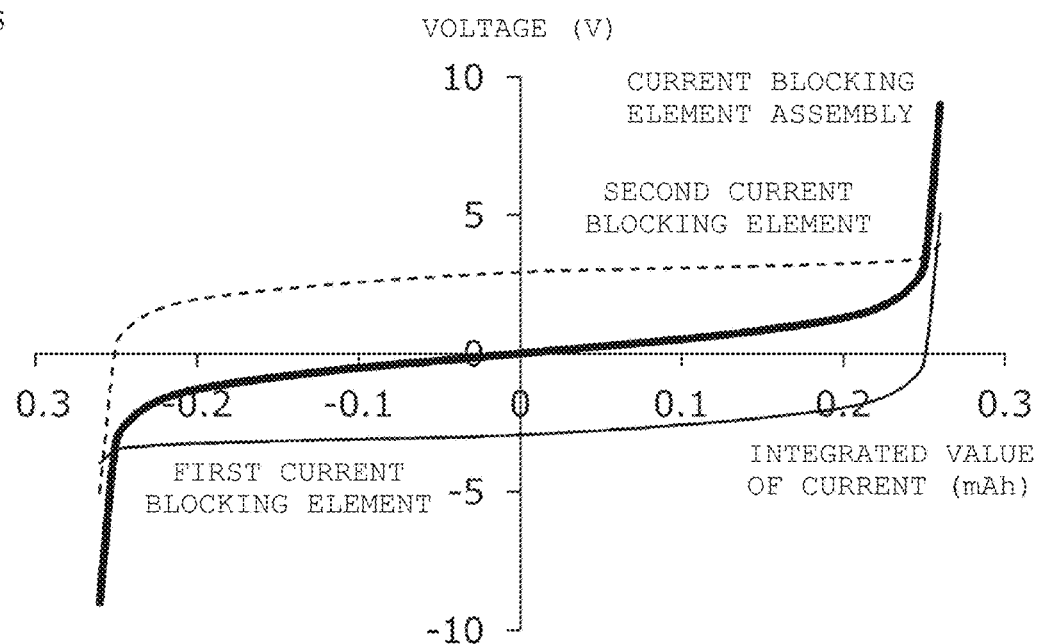
FIG. 5 is a view schematically showing a relationship between an integrated amount of current in a current blocking element assembly and voltage output from the current blocking element assembly according to an embodiment of the present disclosure.

In the current blocking element assembly 12 of Example 2, lithium ions serving as a carrier of electric charge come to be no longer present when the ions held in one electrode layer (specifically, the first-A electrode layer 31A) are depleted or when the ions held in the other electrode layer (specifically, the second-A electrode layer 32A) are saturated, that is, when the lithium ions can no longer move from the first-A electrode layer 31A via the ion conductive layer 33A to the second-A electrode layer 32A, and in still other words, when the integrated value of electric current flowing within the first current blocking element 13 exceeds the threshold value. As a result of this, the electric current can no longer be let to flow in the current blocking element assembly 12, thereby leading to an insulation state, or else the internal resistance of the current blocking element assembly 12 rises suddenly and rapidly, so that the electric current is automatically blocked. Here, FIG. 5 schematically shows a relationship between the integrated amount of electric current in the current blocking element assembly 12 and the voltage output from the current blocking element assembly 12. Here, in FIG. 5, the thin solid line represents the behavior of the first current blocking element 13; the dotted line represents the behavior of the second current blocking element 14, and the thick solid line represents the behavior of the current blocking element assembly 12 obtained by synthesizing the behavior of the first current blocking element 13 and the behavior of the second current blocking element 14.

The current blocking element assembly of Example 2 is formed by lamination of the first-A electrode layer, the ion conductive layer, the second-A electrode layer, the connection layer, the second-B electrode layer, the ion conductive layer, and the first-B electrode layer in this order, and hence has a simple structure and configuration and can be produced at a low cost. Accordingly, the current blocking element assembly of Example 2 can be mounted on a consumable component or the like. Further, for example, when the ink or toner is used up, the current blocking element assembly of Example 2 is brought into a blocked state and, even when a user loads the ink tank or toner cartridge with an unauthorized ink or toner, the user cannot use the printer, that is, the product, because the ink tank or toner cartridge does not operate. This can prevent with certainty the unexpected disorder or inconvenience caused by use of the unauthorized ink or toner.

Figure 6:
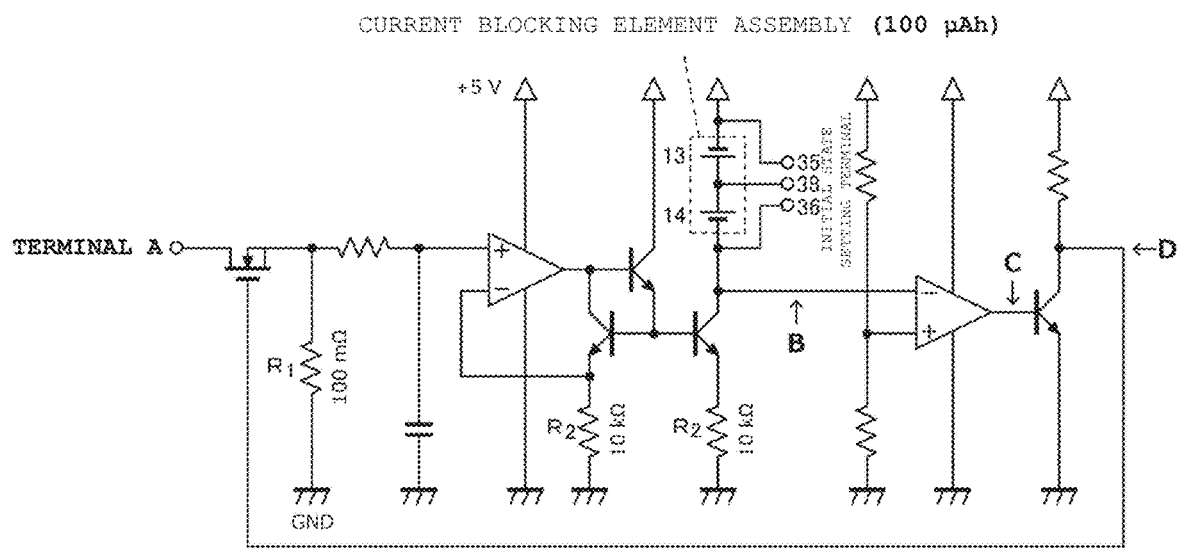
FIG. 6 is another applied circuit diagram of a current mirror circuit.

FIG. 6 shows another applied circuit diagram (current proportional circuit) of the current mirror circuit. Here, the applied circuit diagram shown in FIG. 6 is an example of an applied circuit of a current blocking element assembly in which the current mirror circuit in FIG. 4B is replaced with the current proportional circuit of FIG. 3, and further, a current blocking circuit is added.

In the illustrated example, the resistance value of $R_1$ is set to be 100 milliohm, and the resistance value of $R_2$ is set to be 10 kiloohm, so that the electric current flowing in the current blocking element assembly is compressed to be one hundred thousandth ($1 \times 10^{-5}$ times multiple). Assuming that the capacity of the current blocking element assembly (integrated value of electric current) is 100 microampere·hour, the MOSFET is turned into an off-state to stop operation of the product when the integrated value of electric current flowing into the current input terminal (denoted by "terminal-A") reaches 10 ampere·hour. The specification procedure and operation principle of this circuit are as follows.

First, via the connection sections 35, 36 and the third terminal section 38 serving as terminals for setting an initial state, in the first current blocking element 13 (capacity: 100 microampere·hour) constituting the current blocking element assembly 12, the ion state in the first-A electrode layer 31A is set to be a saturated state, and the ion state in the second-A electrode layer 32A is set to be a depleted state. On the other hand, in the second current blocking element 14 (capacity: 100 microampere·hour), the ion state in the first-B electrode layer 31B is set to be a depleted state, and the ion state in the second-A electrode layer 32A is set to be a saturated state. In this state, the impedance of the current blocking element assembly 12 is low, and the voltage at the B-point is in a high state. For this reason, the voltage at the C-point, which is an output of the comparator circuit, is in a low state, and the voltage at the D-point is in a high state, so that the MOSFET is turned into an on-state. This is the state before use of the current blocking element assembly 12 (initial state).

When electric current is let to flow into the terminal-A, movement of ions from the first-A electrode layer 31A to the second-A electrode layer 32 is generated in the first current blocking element 13 in the current blocking element assembly 12 for the amount of the electric current value corresponding to just the one hundred thousandth of that electric current value. On the other hand, in the second current blocking element 14, movement of ions from the second-B electrode layer 32B to the first-B electrode layer 31B is generated. Here, in FIG. 6, for the sake of convenience, the first current blocking element 13 and the second current blocking element 14 are illustrated with the symbol of "battery". Further, the first-A electrode layer 31A and the first-B electrode layer 31B are denoted with the symbol of "negative electrode" of the battery, and the second-A electrode layer 32A and the second-B electrode layer 32B are denoted with the symbol of "positive electrode" of the battery. Since the first current blocking element 13 and the second current blocking element 14 have the same capacity, the ion state in the first-A electrode layer 31A will be a depleted state or else the ion state in the second-A electrode layer 32A will be a saturated state when the integrated value of electric current flowing into the current input terminal (terminal-A) reaches 10 ampere·hour. Also, the ion state in the first-B electrode layer 31B will be a saturated state or else the ion state in the second-B electrode layer 32B will be a depleted state. Further, in this state, the impedance of the current blocking element assembly 12 is high; the voltage at the B-point is in a low state; the voltage at the C-point, which is an output of the comparator circuit, is in a high state, and the voltage at the D-point is in a low state, so that the MOSFET is turned into an off-state. Thus, the electric current no longer flows into the current input terminal (terminal-A). Further, the off-state of the MOSFET is detected to stop operation of the product 10A.

Example 3

Figure 7:
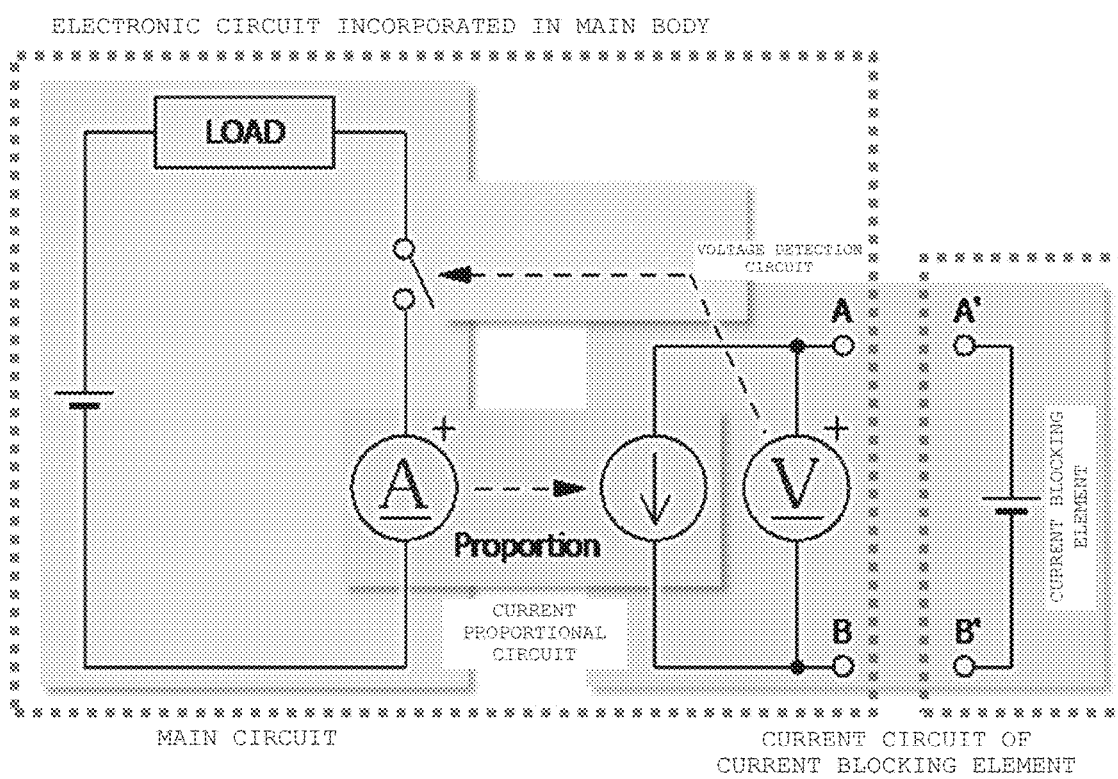
FIG. 7 is a model view of [type 1] among the four cases in total of the states in which a current blocking element or a current blocking element assembly is or is not incorporated in a product and is separated from or is incorporated in the product according to an embodiment of the present disclosure.
Figure 8:
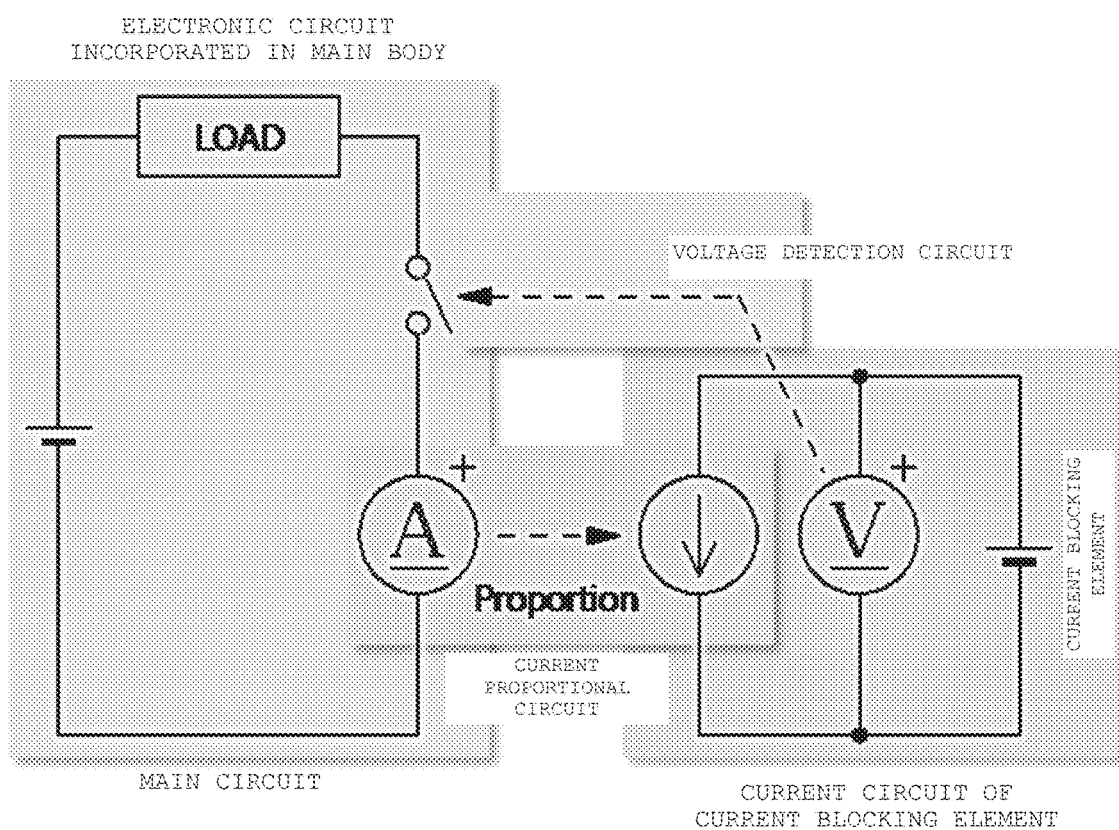
FIG. 8 is a model view of [type 2] among the four cases in total of the states in which a current blocking element or a current blocking element assembly is or is not incorporated in a product and is separated from or is incorporated in the product according to an embodiment of the present disclosure.
Figure 9:
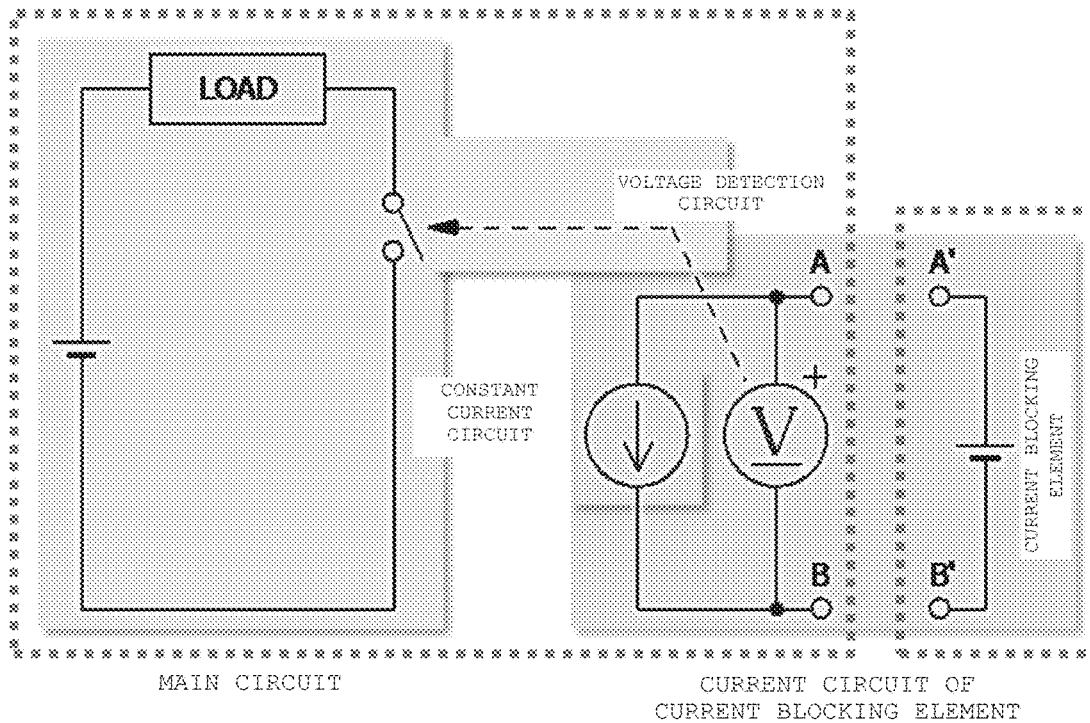
FIG. 9 is a model view of [type 3] among the four cases in total of the states in which a current blocking element or a current blocking element assembly is or is not incorporated in a product and is separated from or is incorporated in the product according to an embodiment of the present disclosure.
Figure 10:
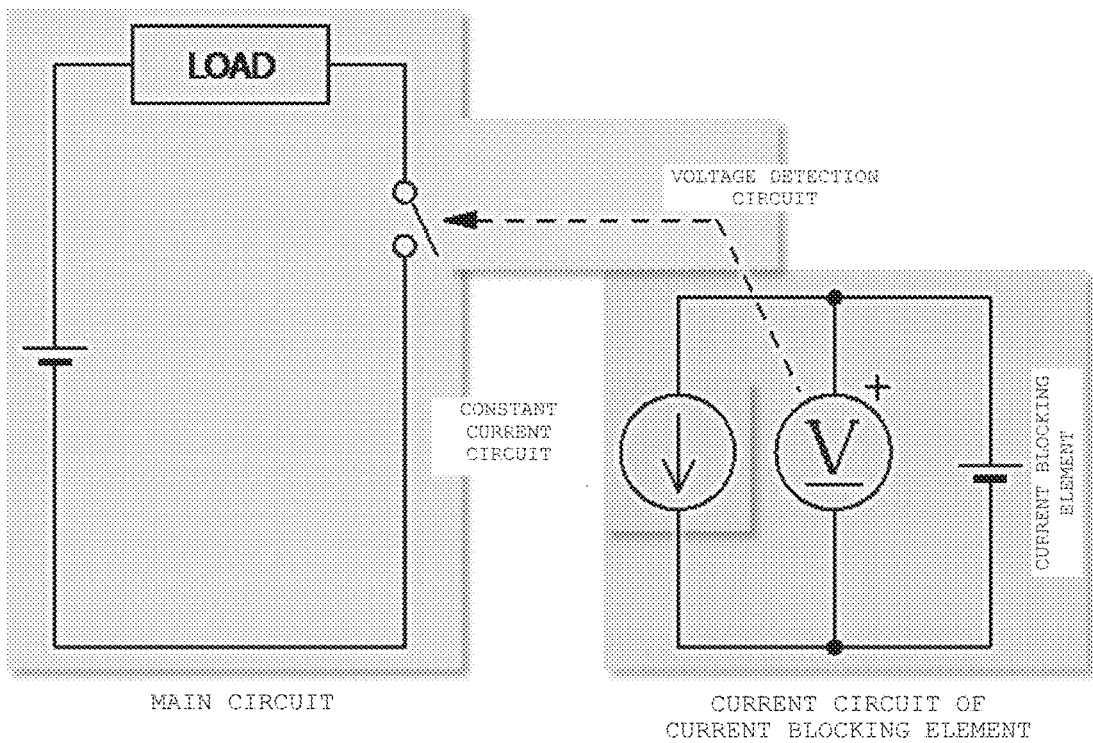
FIG. 10 is a model view of [type 4] among the four cases in total of the states in which a current blocking element or a current blocking element assembly is or is not incorporated in a product and is separated from or is incorporated in the product according to an embodiment of the present disclosure.

The current blocking element 11 and the current blocking element assembly 12 described in Examples 1 to 2 are mounted on a product; however these may be incorporated in the product (See FIGS. 8 and 10), or in a state being separated from the product (See FIGS. 7 and 9). Also, in Examples 1 to 2, a mode has been described (See FIGS. 7 and 8) in which the electric current flowing through the current blocking element 11 or the current blocking element assembly 12 is blocked, and further the operation of the product is stopped when the integrated value of electric current flowing through the current blocking element 11 or the current blocking element assembly 12 exceeds the threshold value. Alternatively, a mode can be adopted (See FIGS. 9 and 10) in which the electric current flowing through the current blocking element 11 or the current blocking element assembly 12 is blocked, and further the operation of the product is stopped when the time-integrated value of electric current flowing through the current blocking element 11 or the current blocking element assembly 12 exceeds the threshold value. Here, for the sake of convenience, the example shown in FIG. 7 is referred to as [Type 1]; the example shown in FIG. 8 is referred to as [Type 2]; the example shown in FIG. 9 is referred to as [Type 3]; and the example shown in FIG. 10 is referred to as [Type 4].

Any of these types is basically configured from four circuit blocks, that is, a main circuit provided in the product, a current blocking element or a current blocking element assembly, a voltage detection circuit, and a current proportional circuit or constant-current circuit, and also, a current path (current circuit) of the current blocking element or current blocking element assembly is provided, whereby the current blocking element or current blocking element assembly is operated in accordance with the current integrated value of the main circuit or the lapse of time, and the operation of the main circuit is restricted when, for example, the potential difference between the first electrode layer and the second electrode layer of the current blocking element becomes lower than a prescribed value.

Figure 11A:
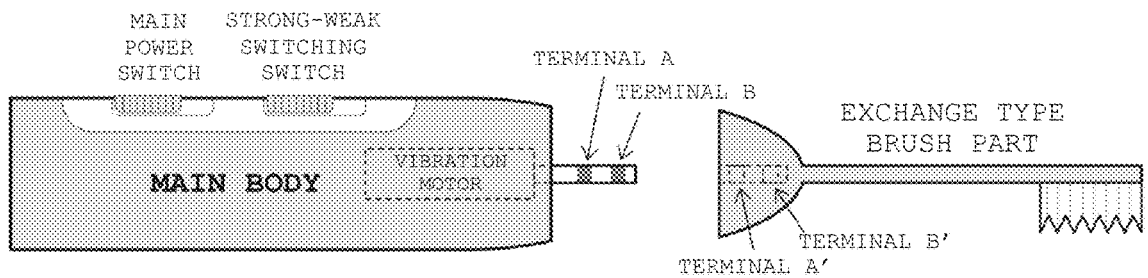
FIGS. 11A and 11B are a conceptual view and a circuit diagram of an electric tooth brush in which a brush portion is an exchangeable consumable component, respectively, according to an embodiment of the present disclosure.
Figure 11B:
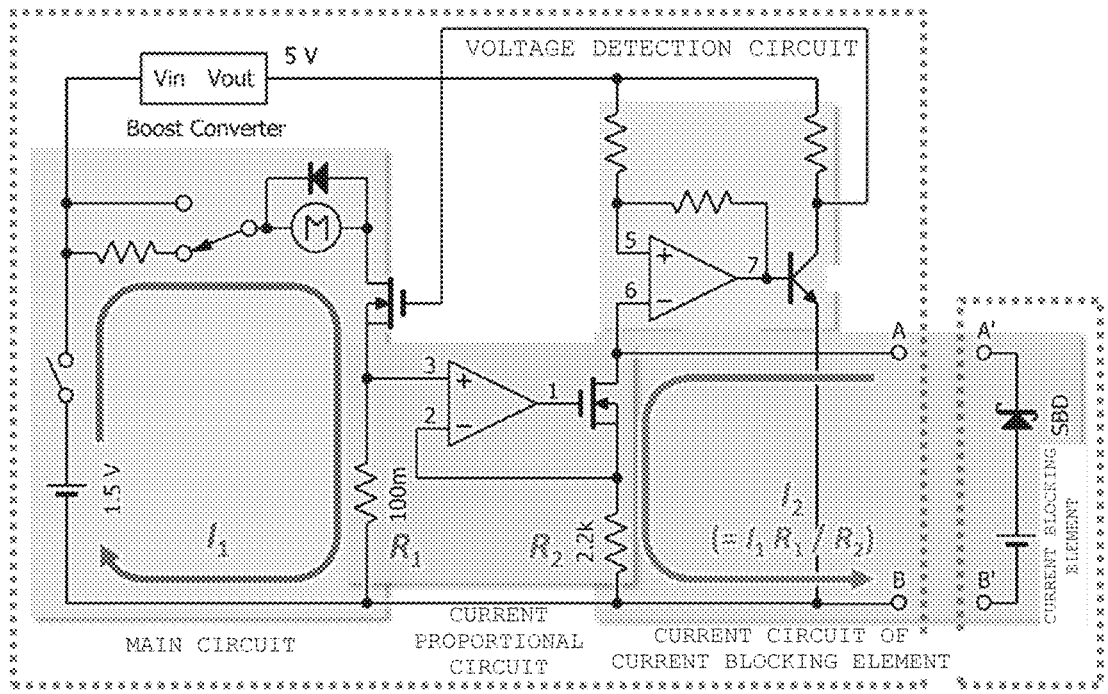

Hereafter, an example of [Type 1] which is a product such as an electric tooth brush provided with an exchange type brush part will be described. Specifically, in this example, the exchange type brush part is the consumable component, and the current blocking element or current blocking element assembly of Examples 1 to 2 is provided in the exchange type brush part. A conceptual view of the electric tooth brush is shown in FIG. 11A, and the circuit is shown in FIG. 11B. Here, in the following description, an example using the current blocking element 11 will be described; however, the current blocking element assembly 12 can be used as well. Here, the current blocking element is illustrated with the symbol of "battery". Further, the first electrode layer is denoted with the symbol of "negative electrode" of the battery, and the second electrode layer is denoted with the symbol of "positive electrode" of the battery. Also, in the following description, the current blocking element of Example 1 and the current blocking element assembly of Example 2 may be referred to as "current blocking element or the like of Examples" as a general term.

The main body part of the electric tooth brush and the consumable component (exchange type brush part) are connected by two pairs of terminals (terminal-A to terminal A' and terminal-B to terminal B'). A current blocking element (not illustrated in the drawings) having a capacity of about 500 microampere·hour is mounted on the consumable component (exchange type brush part). In the initial state, the ions in the first electrode layer are in a saturated state. When a main power switch provided in the main circuit that is disposed in the inside of the electric tooth brush is turned on, electric current flows through a vibration motor, and the exchange type brush part is vibrated. During this period, information on the driving current flowing through the vibration motor is transmitted to the current blocking element by passing through the current proportional circuit.

Then, an electric current value corresponding to about one 22000th of the motor driving current flows through the current blocking element mounted on the consumable component (exchange type brush part). This electric current is a value determined by the following equation.

$$I_2 = (R_1/R_2) \times I_1$$

The voltage of the current blocking element is monitored by a voltage detection circuit provided in the main circuit. The potential difference between the first electrode layer and the second electrode layer when the ions in the first electrode layer are in a saturated state (hereafter referred to as "potential difference in current blocking element") is about 4.15 volt. The potential difference in the current blocking element decreases when the integrated value of the electric current flowing through the current blocking element increases. Further, when the potential difference comes to be lower than a preset threshold value (which may be other than 0 volt and may be, for example, around 1.2 volt), the MOSFET connected in series to the vibration motor in the main circuit is turned into an off-state, and the vibration motor can no longer be driven. In order that the vibration motor can be driven again, the consumable component must be replaced with a new one. Thus, insufficient brushing of teeth due to continuation of use of the deteriorated consumable component by the user can be prevented.

Figure 12:
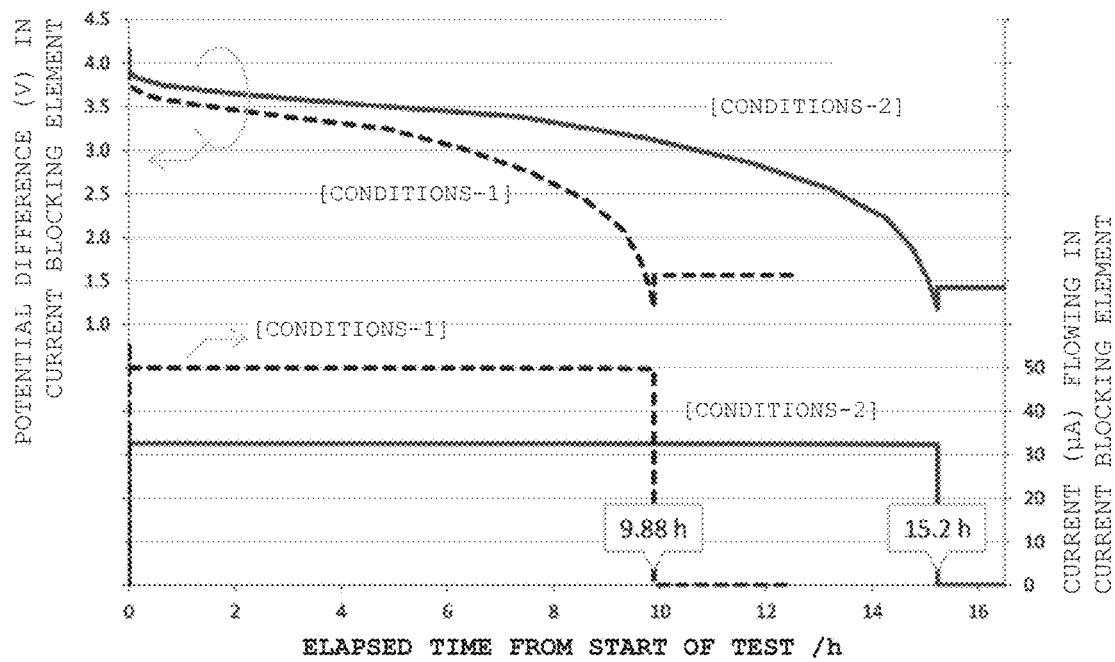
FIG. 12 is a view showing a simulation result of an energization experiment under [condition-1] and [condition-2] using a circuit simulator LTspice IV according to an embodiment of the present disclosure.
Figure 13:
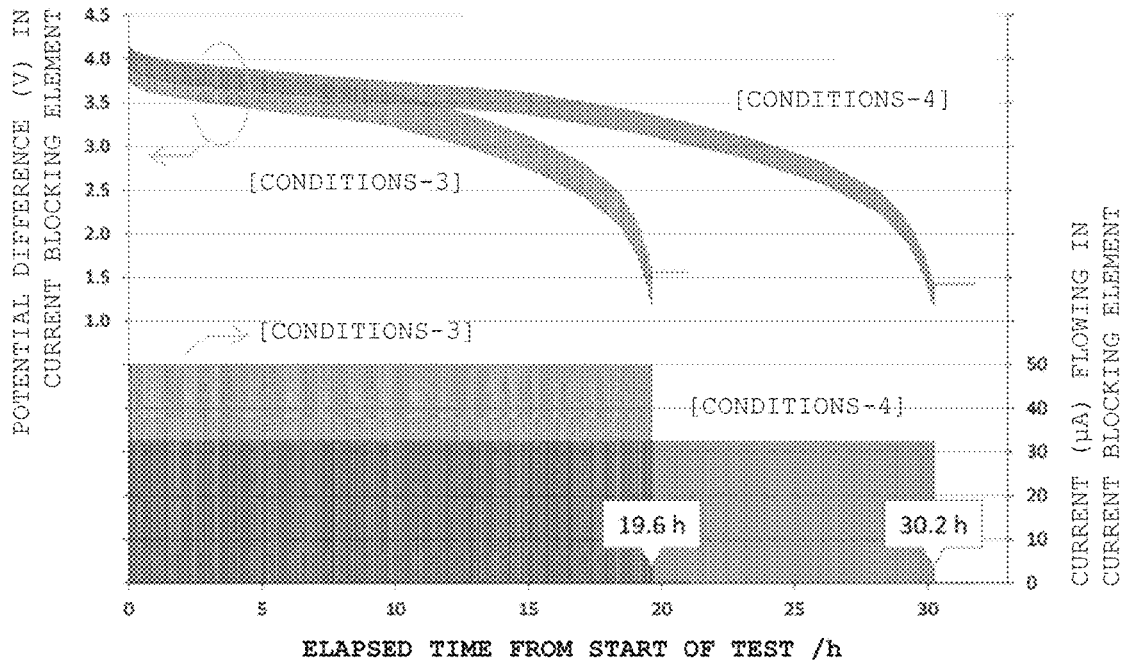
FIG. 13 is a view showing a simulation result of an energization experiment under [condition-3] and [condition-4] using a circuit simulator LTspice IV according to an embodiment of the present disclosure.
Figure 14:
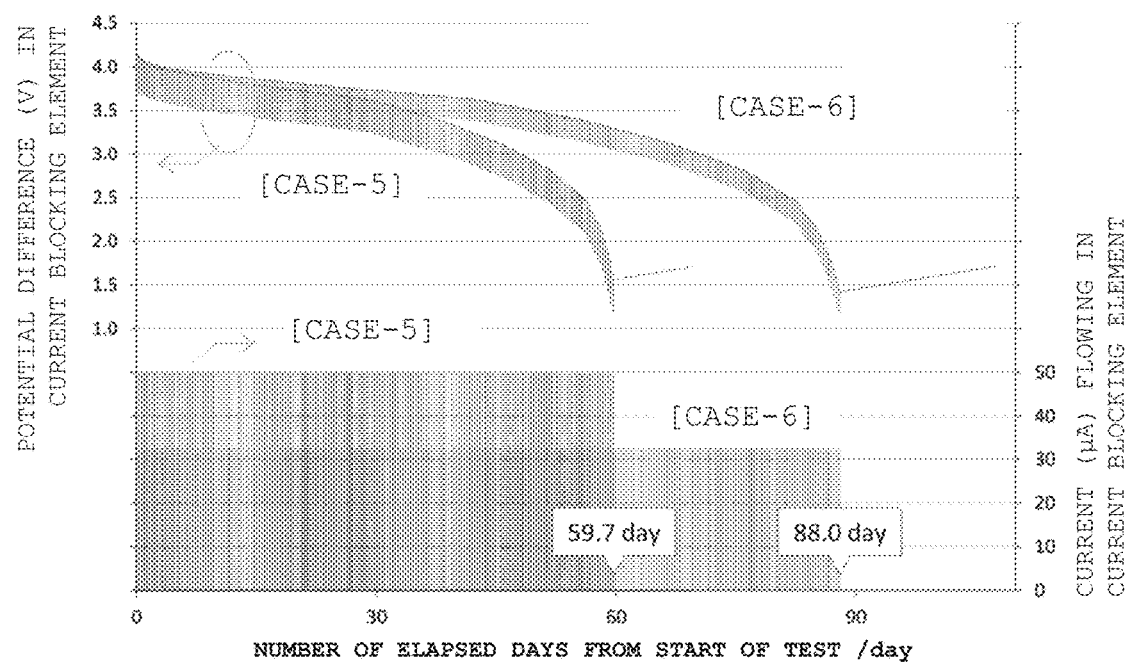
FIG. 14 is a view showing a simulation result of an energization experiment under [condition-5] and [condition-6] using a circuit simulator LTspice IV according to an embodiment of the present disclosure.
Figure 15:
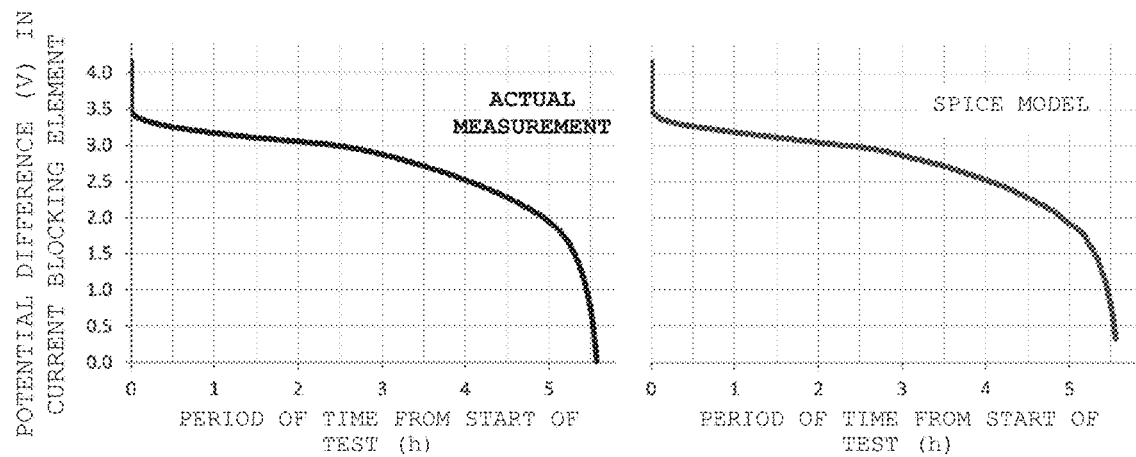
FIG. 15 is a view showing a simulation result of potential difference in a current blocking element using a circuit simulator LTspice IV and potential difference in an actual current blocking element according to an embodiment of the present disclosure.

Simulation on energization experiments under the following six conditions was carried out with use of a circuit simulator LTspice IV. The results are shown in Table 1 and FIGS. 12, 13, and 14. Also, the simulation result of the potential difference in the current blocking element using the circuit simulator LTspice IV and the potential difference in an actual current blocking element are shown in FIG. 15. From FIG. 15, it will be understood that the simulation using the circuit simulator LTspice IV has validity.

[Condition-1]
Continuous use in a strong mode
[Condition-2]
Continuous use in a weak mode
[Condition-3]
Intermittent use in a strong mode (repetition of three-minute use and three-minute stoppage)
[Condition-4]
Intermittent use in a weak mode (repetition of three-minute use and three-minute stoppage)
[Condition-5]
Intermittent use in a strong mode (three-minute use for every eight hours)
[Condition-6]
Intermittent use in a weak mode (three-minute use for every eight hours)

As shown by the above results, irrespective of how the electric tooth brush is used, that is, irrespective of whether the electric tooth brush is used in the strong mode or in the weak mode, or the frequency of using the electric tooth brush (duty ratio), the potential difference in the current blocking element comes to be lower than the preset threshold value at the time point at which the integrated value of electric current flowing through the vibration motor reaches about 10 ampere-hour, and thereafter, the vibration motor is no longer usable, and the electric tooth brush is brought into a non-usable state.

The period of time until the electric tooth brush became no longer usable was 60 days (about two months) under [Condition-5] that assume use after each meal for three times a day, such as three-minute use for every eight hours, and was 88 days (about three months) under [Condition-6]. When such a number of days pass, deterioration of the exchange type brush part becomes conspicuous, and it is time for exchange. It goes without saying that the number of days can be made longer or shorter by selection of the resistance value. By appropriately setting the resistance value in accordance with the durability of the exchange type brush part, the deteriorated exchange type brush part can be prevented from being kept used by the user, and insufficient brushing of teeth can be prevented.

Information on the period of time until the electric tooth brush becomes no longer usable is stored in the current blocking element incorporated in the inside of the exchange type brush part. Accordingly, even when the exchange type brush part is dismounted during the period of use, the information on the remaining period of time is not reset. For example, even in a case in which a plurality of exchange type brush parts are frequently switched to one another and used with respect to one electric tooth brush main body, each of the exchange type brush parts keeps the correct remaining period of time, so that problems such as a situation in which an exchange type brush part becomes no longer usable before being deteriorated or a situation in which an exchange type brush part is kept being used despite the fact that the exchange type brush part is already deteriorated, are not generated.

It is preferable that a diode is connected in series to the current blocking element. This provides an advantage such that the ion holding state of each electrode layer in the current blocking element cannot be changed by operation from outside. In other words, the period of time for use cannot be extended in an unauthorized manner. By soldering the current blocking element onto a printed wiring board, unauthorized exchange is rendered difficult. The voltage detection circuit needs to be a Schmitt trigger circuit having a positive feedback. This is because, since the internal resistance of the current blocking element at the time of

TABLE 1

| | Duty ratio | Period of time till stoppage | Driving current of motor | | Current flowing through current blocking element | |
|---|---|---|---|---|---|---|
| | | | Driving current | Integrated value | Current | Integrated value |
| 1 | 100% | 9.88 h | 1.10 A | 10.8 Ah | 50.0 μA | 493 μAh |
| 2 | 100% | 15.2 h | 714 mA | 10.9 Ah | 32.6 μA | 496 μAh |
| 3 | 50% | 16.9 h | 1.10 A | 10.8 Ah | 50.0 μA | 494 μAh |
| 4 | 50% | 30.2 h | 714 mA | 10.9 Ah | 32.6 μA | 496 μAh |
| 5 | 0.625% | 59.7 day | 1.10 A | 9.91 Ah | 50.0 μA | 491 μAh |
| 6 | 0.625% | 88.0 day | 714 mA | 9.49 Ah | 32.6 μA | 490 μAh | operation stoppage of the current blocking element is large, the overvoltage becomes high, and a large voltage rise occurs immediately after the operation stoppage of the current blocking element. When the detected voltage does not have a hysteresis, an oscillation phenomenon occurs when the period of time for use expires.

Example 4

Figure 16:
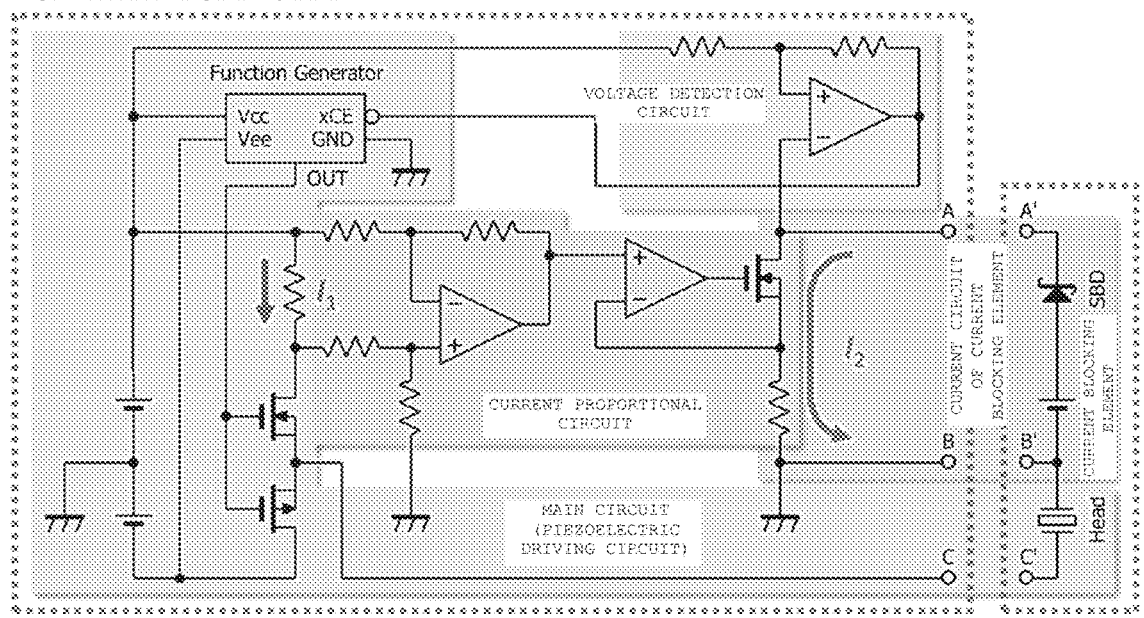
FIG. 16 is an equivalent circuit diagram in an example in which the current blocking element is applied to an ink jet printer of piezoelectric type as an example of [type 4] according to an embodiment of the present disclosure.

Example 4 is a modification of Example 3. In Example 4, a case in which the current blocking element is applied to an ink jet printer of piezoelectric type is shown as an example of [Type 1] (See the equivalent circuit diagram of FIG. 16). The ink jet printer has a piezoelectric driving circuit in the main body part and has a head including a piezoelectric element in the consumable component (ink tank). A function generator (Function Generator) is provided in the piezoelectric driving circuit in the main body part and creates a waveform signal for driving the piezoelectric element. The waveform signal having a high impedance, which is output from the function generator, is turned into one having a low impedance by a driving circuit having an re-channel type FET disposed on the high side and a p-channel type FET disposed on the low side, whereby the piezoelectric element in the consumable component is driven. Further, by movement of this piezoelectric element, the ink in the ink tank is ejected from the head.

On the consumable component, a current blocking element is mounted besides the piezoelectric element and, in the initial state, the ions in the first electrode layer are in a saturated state. Information on the electric current value $I_1$ that is let to flow through the piezoelectric element is sent out to the current blocking element by passing through the current proportional circuit serving also as a differential amplification circuit. Further, an electric current value $I_2$ proportional to the electric current value $I_1$ is let to flow through the current blocking element mounted on the consumable component (The value of $I_1$ is always positive, and the value of $I_2$ is also always positive, that is, only in the discharging direction). The potential difference in the current blocking element is monitored at all times by the voltage detection circuit in the main body. The potential difference in the current blocking element (potential difference between the first electrode layer and the second electrode layer) in the initial state is about 4.15 volt; however, when electric current flows through the current blocking element, the potential difference in the current blocking element gradually decreases. When the potential difference comes to be lower than a preset threshold value, the output of the voltage detection circuit is brought into a high state, and this is input into a chip enable terminal xCE of negative logic of the function generator, and the piezoelectric driving circuit can no longer be operated. Once such a state is attained, even if ink is present in the ink tank, the ink cannot be ejected from the head. In order that the ink can be ejected again, the ink tank must be replaced with a new one.

Here, the capacity of the current blocking element, the electric current value that is let to flow, and the like are set in advance so that the potential difference in the current blocking element may not come to be lower than the preset threshold value even when all of the ink originally incorporated in the ink tank is used up. In other words, it is so constructed that a situation in which the potential difference in the current blocking element comes to be lower than the preset threshold value is not generated except when the ink tank that has once become empty is reloaded with ink by the user. This can prevent a situation in which the printer itself goes out of order by use of the forcibly reloaded ink tank.

Example 5

In Example 5, a case of [Type 4] will be described below in which the current blocking element 11 or the current blocking element assembly 12 described in Examples 1 to 2 are incorporated in a product, and the electric current flowing through the current blocking element 11 or the current blocking element assembly 12 is blocked when the time-integrated value of the electric current flowing through the current blocking element 11 or the current blocking element assembly 12 exceeds a threshold value, and further, operation of the product is stopped.

Figure 17A:
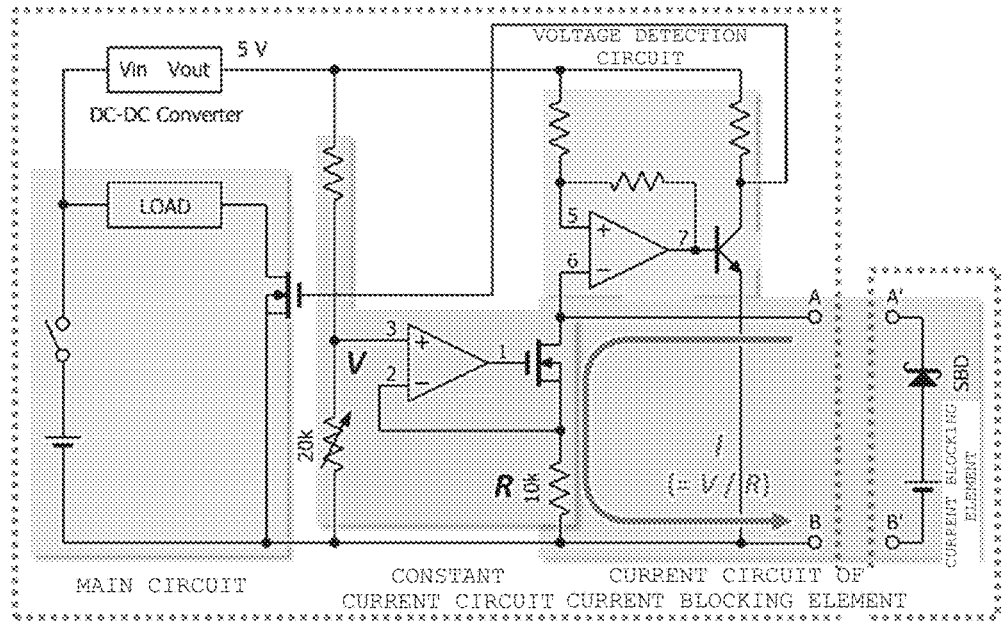
FIGS. 17A and 17B are an equivalent circuit diagram of an applied example in which the product becomes unusable when the integrated time of the power on-state reaches about 24 hours and a graph showing a relationship between the integrated time of a power on-state in a main circuit and potential difference in a current blocking element, respectively, according to an embodiment of the present disclosure.
Figure 17B:
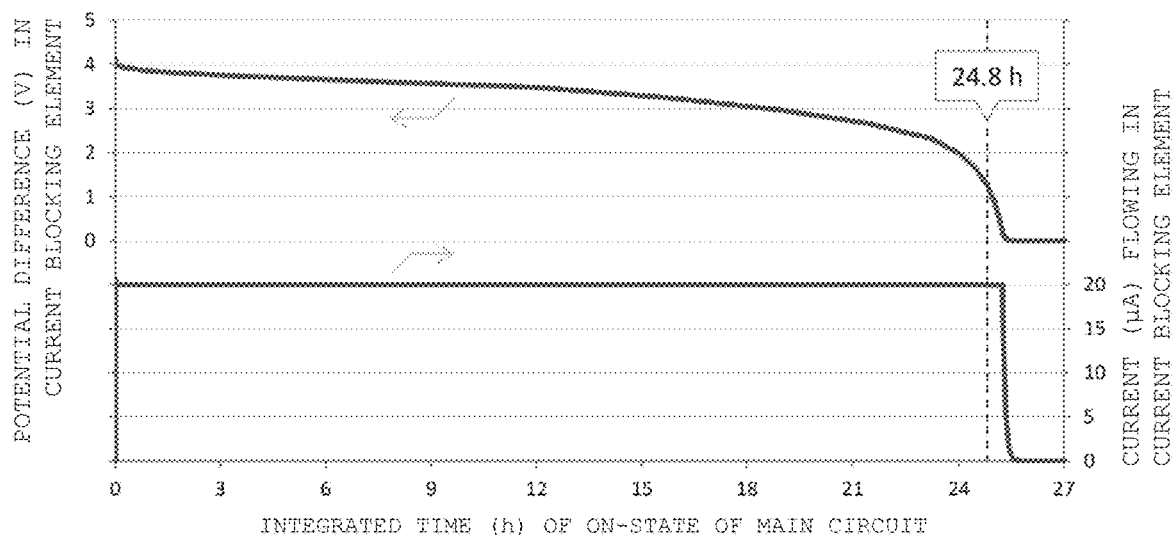

Specifically, an applied example will be shown in which the product comes to be no longer usable when the integrated period of time during which the power is on reaches about 24 hours (See the equivalent circuit diagram of FIG. 17). Simulation carried out using LTspice gave a result such that, when the potentiometer is set so that the voltage of the non-inverting input terminal (third pin) of the operation amplifier in the constant-current circuit would be just 200 millivolt, the potential difference in the current blocking element comes to be lower than a preset threshold value to bring the MOSFET of the main circuit into an off-state when 24.8 hours pass after the power of the main circuit is turned on, whereby the electric current can no longer be let to flow through the main circuit (See FIG. 17B). Here, in FIG. 17B, the lateral axis represents the integrated time during which the power of the main circuit is in an on-state, and the longitudinal axis represents the potential difference in the current blocking element.

Here, the ion conductive layer in the current blocking element and the like of Examples used in [Type 3] and [Type 4] must be configured from a solid layer so that an inconvenience may not be generated even when an overly discharged state is attained, because electric current continues to flow even when the potential difference in the current blocking element and the like of Examples comes to be lower than a preset threshold value to bring the MOSFET of the main circuit into an off-state. When the product itself is a consumable component or a consumable article, the current blocking element and the like of Examples used in [Type 3] and [Type 4] can be mounted on an apparatus that is intended to be used only for one day, such as goods distributed in a theme park or an event meeting space or receivers used in a listening comprehension test for a foreign language.

Also, among the medical electronic apparatus used in hospitals, there are numerous apparatus that are used by mounting consumable components or consumable articles having a predetermined time limit of use. For example, there are a HEPA filter of an air cleaner for medical institutions, a sterilization filter of an inhalation oxygen generator, an energization pad of a low-frequency treatment apparatus, and the like. These are ones in which the time limit of use must be strictly observed. When a current blocking element or a current blocking element assembly is mounted on each of these consumable components or consumable articles, errors such that the time limit of use passes and that the consumable components or consumable articles are kept being used in a situation with decrease or deterioration in functions or with corrosions, can be eliminated There are numerous consumable components and the like in medical apparatus in which the time limit of use is designated by a date. However, when management can be carried out based on the integrated value of consumption current or the integrated value of time for use of the medical apparatus, the consumable components and the like can be managed and replaced reasonably with less amount of waste in accordance with the actual degree of deterioration of the consumable components and the like. In other words, the state that the consumable components and the like in the medical apparatus are equipped with a current blocking element or a current blocking element assembly provides not only a significance as a risk management for preventing medical accidents but also an economic significance.

As shown above, the present disclosure has been described with reference to the preferable Examples; however, the present disclosure is not limited to these Examples. The configuration and structure of the current blocking element or current blocking element assembly, the materials put to use, the configuration and structure of the products, and the like are exemplifications and can be suitably changed. Also, each of various numerical values related to the operation of the current blocking element or current blocking element assembly is an exemplification and can be suitably changed. Depending on the cases, in the current blocking element assembly of the present disclosure, it is possible to adopt a configuration in which the first-A electrode layer and the first-B electrode layer are electrically connected. In this case, for example, the first-A electrode layer and the first-B electrode layer only need to be disposed to oppose each other with a connection layer interposed therebetween. In other words, a current blocking element assembly only need to be configured from a lamination structure that is formed by lamination of the second-A electrode layer, the ion conductive layer, the first-A electrode layer, the connection layer, the first-B electrode layer, the ion conductive layer, and the second-B electrode layer.

In the Examples, an example has been given in which the carrier of electric charge is lithium ions; however, fluoride ions, hydroxide ions, oxygen ions, or carbonate ions may serve as the carrier, or alternatively, sodium ions, potassium ions, magnesium ions, calcium ions, aluminum ions, or protons may serve as the carrier. An all-solid battery having fluoride ions as a carrier is expected to have a high prospect as the second form of the all-solid batteries, and a wide variety of solid electrolytes are already reported. With respect to protons and oxygen ions, a wide variety of solid electrolytes are already reported in the research and development of fuel batteries so far. By using these, inexpensive current blocking elements or current blocking element assemblies can be constructed.

When the fluoride ions are a carrier, it is possible to adopt a configuration in which:
  the ions are fluoride ions;
  the first electrode layer, or the first-A electrode layer and the first-B electrode layer, contain a metal fluoride (for example, specifically the metal fluoride described above);
  the second electrode layer, or the second-A electrode layer and the second-B electrode layer, contain a metal fluoride (for example, specifically the metal fluoride described above); and
  the ion conductive layer, or the ion conductive layer constituting the first current blocking element and the second current blocking element, include a solid electrolyte layer having fluoride ion conductivity (for example, specifically the solid electrolyte layer described above).

Further, when hydroxide ions are used as a carrier, for example, a hydrogen storing alloy can be used as the electrode layer, and potassium hydroxide can be used as the ion conductive layer. When oxygen ions are used as a carrier, for example, a hydrogen storing alloy can be used as the electrode layer, and stabilized zirconia can be used as the ion conductive layer. When carbonate ions are used as a carrier, for example, a hydrogen storing alloy can be used as the electrode layer, and a carbonate can be used as the ion conductive layer. When sodium ions are used as a carrier, for example, metal sodium can be used as the electrode layer, and β-alumina can be used as the ion conductive layer. When sodium ions, potassium ions, or magnesium ions are used as a carrier, a Prussian blue analogue, for example, can be used as the electrode layer and the ion conductive layer. When protons are used as a carrier, for example, a hydrogen storing alloy can be used as the electrode layer, and an ion exchange membrane such as Nafion or phosphoric acid can be used as the ion conductive layer.

Hereafter, description on the materials and the like constituting the first electrode layer and the second electrode layer in the case in which the ions are lithium ions will be given.

As a material constituting the first electrode layer and the like, a carbon material can be mentioned as an example besides the aforementioned materials. The carbon materials undergo extremely little change in the crystal structure at the time of storage and release of lithium, and hence can stably hold a large amount of ions. Also, since the carbon materials function as an electroconductive material, the electric conductivity of the first electrode layer and the like is improved. Examples of the carbon materials include easily graphitizable carbon (soft carbon), hardly graphitizable carbon (hard carbon), graphite (graphite), and highly crystalline carbon material with developed crystal structure. However, the planar interval of the (002) plane in the hardly graphitizable carbon is preferably 0.37 nm or more, and the planar interval of the (002) plane in the graphite is preferably 0.34 nm or less. More specifically, examples of the carbon materials include organic polymer compound fired-bodies that can be obtained by firing (carbonizing) thermally decomposed carbons; cokes such as pitch cokes, needle cokes, and petroleum cokes; graphites; glass-form carbon fibers; and polymer compounds such as phenolic resins and furan resins at a suitable temperature; carbon fibers; activated carbon; carbon blacks; and polymers such as polyacetylene. Also, as the carbon materials, a low crystalline carbon thermally treated at a temperature of about 1000° C. or lower can be mentioned besides the above, or else, an amorphous carbon can be used as well. The shape of the carbon materials may be any of a fiber-like shape, spherical shape, particle-like shape, and scale-like shape.

Alternatively, the material constituting the first electrode layer and the like may be, for example, a material containing one kind or two or more kinds of either one of a metal element and a half metal element as a constituent element (hereafter referred to as "metal-based material"), and a large amount of ions can be held by this. The metal-based material may be any of a single element, an alloy, and a compound, or a material configured from two or more kinds of these, or a material having one kind or two or more kinds of these phases in at least a part thereof. In addition to the materials made of two or more kinds of metal elements, the alloys include materials containing one or more kinds of metal elements and one or more kinds of half metal elements. Also, the alloy may include a non-metal element. Examples of the structure of the metal-based materials include solid solutions, eutectic crystals (eutectic mixtures), intermetallic compounds, and substances in which two or more kinds of these coexist.

As the metal element and half metal element, metal elements and half metal elements capable of forming an alloy with lithium can be mentioned as examples. Specific examples thereof include magnesium <Mg>, boron <B>, aluminum <Al>, gallium <Ga>, indium <In>, silicon <Si>, germanium <Ge>, tin <Sn>, lead <Pb>, antimony <Sb>, bismuth <Bi>, cadmium <Cd>, silver <Ag>, zinc <Zn>, hafnium <Hf>, zirconium <Zr>, yttrium <Y>, palladium <Pd>, and platinum <Pt>. Among these, silicon <Si> and tin <Sn> are excellent in the capability of storing and releasing lithium and are preferable because of having a capability to hold a further larger amount of ions.

The material containing silicon as a constituent element may be a single element of silicon, a silicon alloy, or a silicon compound, or a material configured from two or more kinds of these, or a material having one kind or two or more kinds of these phases in at least a part thereof. The material containing tin as a constituent element may be a single element of tin, a tin alloy, or a tin compound, or a material configured from two or more kinds of these, or a material having one kind or two or more kinds of these phases in at least a part thereof. The single element inherently means a single element in a general meaning of the term and may contain a slight amount of impurities, so that this does not necessarily mean a purity of 100%.

Examples of the elements other than silicon constituting the silicon alloy or silicon compound include tin <Sn>, nickel <Ni>, copper <Cu>, iron <Fe>, cobalt <Co>, manganese <Mn>, zinc <Zn>, indium <In>, silver <Ag>, titanium <Ti>, germanium <Ge>, bismuth <Bi>, antimony <Sb>, and chromium <Cr>, and also carbon <C> and oxygen <O>. Specific examples of the silicon alloy or silicon compound include $SiB_4$, $SiB_6$, $Mg_2Si$, $Ni_2Si$, $TiSi_2$, $MoSi_2$, $CoSi_2$, $NiSi_2$, $CaSi_2$, $CrSi_2$, $Cu_5Si$, $FeSi_2$, $MnSi_2$, $NbSi_2$, $TaSi_2$, $VSi_2$, $WSi_2$, $ZnSi_2$, $SiC$, $Si_3N_4$, $Si_2N_2O$, $SiO_v$ ($0<v\leq2$, preferably $0.2<v<1.4$), and LiSiO.

Examples of the elements other than tin constituting the tin alloy or tin compound include silicon <Si>, nickel <Ni>, copper <Cu>, iron <Fe>, cobalt <Co>, manganese <Mn>, zinc <Zn>, indium <In>, silver <Ag>, titanium <Ti>, germanium <Ge>, bismuth <Bi>, antimony <Sb>, and chromium <Cr>, and also carbon <C> and oxygen <O>. Specific examples of the tin alloy or tin compound include $SnO_w$ ($0<w\leq2$), $SnSiO_3$, $LiSnO$, and $Mg_2Sn$. In particular, the material containing tin as a constituent element is preferably, for example, a material containing the second constituent element and the third constituent element together with tin (first constituent element) (hereafter referred to as "Sn-containing material"). Examples of the second constituent element include cobalt <Co>, iron <Fe>, magnesium <Mg>, titanium <Ti>, vanadium <V>, chromium <Cr>, manganese <Mn>, nickel <Ni>, copper <Cu>, zinc <Zn>, gallium <Ga>, zirconium <Zr>, niobium <Nb>, molybdenum <Mo>, silver <Ag>, indium <In>, cesium <Ce>, hafnium <Hf>, tantalum <Ta>, tungsten <W>, bismuth <Bi>, and silicon <Si>, and examples of the third constituent element include boron <B>, carbon <C>, aluminum <Al>, and phosphorus <P>. When the Sn-containing material contains the second constituent element and the third constituent element, a further larger amount of ions can be held.

Among these, the Sn-containing material is preferably a material containing tin <Sn>, cobalt <Co>, and carbon <C> as constituent elements (hereafter referred to as "SnCoC-containing material"). In the SnCoC-containing material, for example, the content of carbon is 9.9 mass % to 29.7 mass %, and the ratio of the content of tin and cobalt {Co/(Sn+Co)} is 20 mass % to 70 mass %. This is because a large amount of ions can be held. The SnCoC-containing material has a phase including tin, cobalt, and carbon, and the phase thereof is preferably lowly crystalline or amorphous. Since this phase is a reaction phase capable of reacting with lithium, an excellent property is obtained by the presence of the reaction phase. The half-value width (diffraction angle $2\theta$) of the diffraction peak obtained by X-ray diffraction of this reaction phase is preferably one degree or more when a CuKα beam is used as a specific X-ray and the sweeping speed is assumed to be one degree/minute. This is because lithium is more smoothly stored and released. The SnCoC-containing material may in some cases include a phase containing a single element or a part of each constituent element in addition to the lowly crystalline or amorphous phase.

Whether the diffraction peak obtained by X-ray diffraction is one corresponding to the reaction phase capable of reacting with lithium or not can be easily determined when X-ray diffraction charts before and after the electrochemical reaction with lithium are compared. For example, when the position of the diffraction peak changes before and after the electrochemical reaction with lithium, the diffraction peak is one corresponding to the reaction phase capable of reacting with lithium. In this case, for example, the diffraction peak of the lowly crystalline or amorphous reaction phase is seen in the range of $2\theta=20$ degrees to 50 degrees. Such a reaction phase contains, for example, each of the aforementioned constituent elements and seems to be turned lowly crystalline or amorphous mainly due to the presence of carbon.

In the SnCoC-containing material, at least a part of the carbon, which is a constituent element, is preferably bonded to the metal element or half metal element. This is because aggregation and crystallization of tin and the like is suppressed. The bonded state of the elements can be confirmed, for example, by using the X-ray photoelectron spectroscopy (XPS) using an Al—Kα beam, Mg—Kα beam, or the like as a soft X-ray source. When at least a part of carbon is bonded to the metal element or half metal element, the peak of the synthesized wave of the is orbit of carbon (C1s) appears in a region lower than 284.5 eV. Here, it is assumed that energy correction is made so that the peak of the 4f orbit of gold atoms (Au4f) may appear at 84.0 eV. During this, since surface contaminating carbon is typically present on the substance surface, the peak of C1s of the surface contaminating carbon is assumed to be 284.8 eV, and the peak thereof is regarded as the energy reference standard. In the XPS measurement, the waveform of the peak of C1s is obtained in a form including the peak of the surface contaminating carbon and the peak of carbon in the SnCoC-containing material. For this reason, for example, the two peaks only need to be separated from each other by making analysis using a commercially available software. In the waveform analysis, the position of the principal peak that is present on the minimum bound energy side is regarded as the energy reference standard (284.8 eV).

The SnCoC-containing material is not limited to a material (SnCoC) containing tin, cobalt, and carbon as constituent elements. For example, the SnCoC-containing material may contain, as constituent elements, one kind or two or more kinds of silicon <Si>, iron <Fe>, nickel <Ni>, chromium <Cr>, indium <In>, niobium <Nb>, germanium <Ge>, titanium <Ti>, molybdenum <Mo>, aluminum <Al>, phosphorus <P>, gallium <Ga>, bismuth <Bi>, and the like in addition to tin, cobalt, and carbon.

Besides the SnCoC-containing material, a material containing tin, cobalt, iron, and carbon as constituent elements (hereafter referred to as "SnCoFeC-containing material") is also a preferable material. The composition of the SnCoFeC-containing material is arbitrary. As one example, when the content of iron is set to be relatively small, the content of carbon is 9.9 mass % to 29.7 mass %; the content of iron is 0.3 mass % to 5.9 mass %; and the ratio of the content of tin and cobalt {Co/(Sn+Co)} is 30 mass % to 70 mass %. Also, when the content of iron is set to be relatively large, the content of carbon is 11.9 mass % to 29.7 mass %; the ratio of the content of tin, cobalt, and iron {(Co+Fe)/(Sn+Co+Fe)} is 26.4 mass % to 48.5 mass %; and the ratio of the content of cobalt and iron {Co/(Co+Fe)} is 9.9 mass % to 79.5 mass %. This is because a high energy density is obtained in such a composition range. The physical properties (half-value width and the like) of the SnCoFeC-containing material are similar to the physical properties of the SnCoC-containing material described above.

Besides this, examples of the materials constituting the first electrode layer and the like include metal oxides such as iron oxide, ruthenium oxide, and molybdenum oxide; and polymer compounds such as polyacetylene, polyaniline, and polypyrrole.

Among these, the materials constituting the first electrode layer and the like preferably contain both of a carbon material and a metal-based material, due to the following reason. That is, a metal-based material, particularly a material containing at least one of silicon and tin as a constituent element, is liable to be violently expanded or shrunk during the charging/discharging, though having an advantage such as being capable of holding a large amount of ions. On the other hand, a carbon material has an advantage of being hardly expanded or shrunk during the charging/discharging, though being hardly capable of holding a large amount of ions. Accordingly, by using both of a carbon material and a metal-based material, expansion and shrinkage at the time of releasing lithium ions are suppressed.

Examples of the materials constituting the second electrode layer and the like include lithium-containing composite oxides and lithium-containing phosphoric acid compounds besides the aforementioned materials. Details of the lithium-containing composite oxides and lithium-containing phosphoric acid compounds are as follows. Here, the other elements constituting the lithium-containing composite oxides and lithium-containing phosphoric acid compounds may be, for example, any one kind or two or more kinds of the elements belonging to the Group II to Group XV in the long-period type periodic table, though not particularly limited. From the viewpoint of obtaining a high voltage, it is preferable to use nickel <Ni>, cobalt <Co>, manganese <Mn>, and iron <Fe>.

As the material constituting the second electrode layer, it is possible to use a compound represented by the following formula (A) or a LiNiMnO-based material as well.

$$Li_{1+a}(Mn_bCo_cNi_{1-b-c})_{1-a}M^0{}_dO_{2-e} \quad (A)$$

Here, "$M^0$" is at least one kind of the elements belonging to the Group II to Group XV in the long-period type periodic table (excluding manganese, cobalt, and nickel), and relationships of $0<a<0.25$, $0.3\le b<0.7$, $0\le c<1-b$, $0\le d\le 1$, and $0\le e\le 1$ are satisfied. Specifically, $Li_{1.15}(Mn_{0.65}Ni_{0.22}Co_{0.13})_{0.85}O_2$ may be mentioned as an example. Also, as the LiNiMnO-based material, specifically $LiNi_{0.5}Mn_{1.50}O_4$ may be mentioned as an example.

As the lithium-containing composite oxides having a layered rock salt type crystal structure, specifically the compounds represented by the formulae (B), (C), and (D) may be mentioned as examples.

$$Li_aMn_{1-b-c}Ni_bM^{11}{}_cO_{2-d}F_e \quad (B)$$

Here, $M^{11}$ is at least one kind of an element selected from the group consisting of cobalt <Co>, magnesium <Mg>, aluminum <Al>, boron <B>, titanium <Ti>, vanadium <V>, chromium <Cr>, iron <Fe>, copper <Cu>, zinc <Zn>, zirconium <Zr>, molybdenum <Mo>, tin <Sn>, calcium <Ca>, strontium <Sr>, and tungsten <W>, and the values of a, b, c, d, and e satisfy:
$0.8\le a\le 1.2$,
$0<b<0.5$,
$0\le c\le 0.5$,
$b+c<1$,
$-0.1\le d\le 0.2$, and
$0\le e\le 0.1$.

However, the composition may differ depending on the state of holding ions, and a is a value in the state in which the ions in the second electrode layer and the like are depleted.

$$Li_aNi_{1-b}M^{12}{}_bO_{2-c}F_d \quad (C)$$

Here, $M^{12}$ is at least one kind of an element selected from the group consisting of cobalt <Co>, manganese <Mn>, magnesium <Mg>, aluminum <Al>, boron <B>, titanium <Ti>, vanadium <V>, chromium <Cr>, iron <Fe>, copper <Cu>, zinc <Zn>, molybdenum <Mo>, tin <Sn>, calcium <Ca>, strontium <Sr>, and tungsten <W>, and the values of a, b, c, and d satisfy:
$0.8\le a\le 1.2$,
$0.005\le b\le 0.5$,
$-0.1\le c\le 0.2$, and
$0\le d\le 0.1$.

However, the composition may differ depending on the state of holding ions, and a is a value in the state in which the ions in the second electrode layer and the like are depleted.

$$Li_aCo_{1-b}M^{13}{}_bO_{2-c}F_d \quad (D)$$

Here, $M^{13}$ is at least one kind of an element selected from the group consisting of nickel <Ni>, manganese <Mn>, magnesium <Mg>, aluminum <Al>, boron <B>, titanium <Ti>, vanadium <V>, chromium <Cr>, iron <Fe>, copper <Cu>, zinc <Zn>, molybdenum <Mo>, tin <Sn>, calcium <Ca>, strontium <Sr>, and tungsten <W>, and the values of a, b, c, and d satisfy:
$0.8\le a\le 1.2$,
$0\le b<0.5$,
$-0.1\le c\le 0.2$, and
$0\le d\le 0.1$.

However, the composition may differ depending on the state of holding ions, and a is a value in the state in which the ions in the second electrode layer and the like are depleted.

Specific examples of the lithium-containing composite oxides having a layered rock salt type crystal structure include $LiNiO_2$, $LiCoO_2$, $LiCo_{0.98}Al_{0.01}Mg_{0.01}O_2$, $LiNi_{0.5}Co_{0.2}Mn_{0.3}O_2$, $LiNi_{0.8}Co_{0.15}Al_{0.0005}O_2$, $LiNi_{0.33}Co_{0.33}Mn_{0.33}O_2$, $Li_{1.2}Mn_{0.52}Co_{0.175}Ni_{0.1}O_2$, and $Li_{1.15}(Mn_{0.65}Ni_{0.22}Co_{0.13})O_2$.

As the lithium-containing composite oxides having a spinel type crystal structure, the compounds represented by the formula (E) may be mentioned as examples.

$$Li_aMn_{2-b}M^{14}{}_bO_cF_d \quad (E)$$

Here, $M^{14}$ is at least one kind of an element selected from the group consisting of cobalt <Co>, nickel <Ni>, magnesium <Mg>, aluminum <Al>, boron <B>, titanium <Ti>, vanadium <V>, chromium <Cr>, iron <Fe>, copper <Cu>, zinc <Zn>, molybdenum <Mo>, tin <Sn>, calcium <Ca>, strontium <Sr>, and tungsten <W>, and the values of a, b, c, and d satisfy:

$0.9 \le a \le 1.1$,
$0 \le b \le 0.6$,
$3.7 \le c \le 4.1$, and
$0 \le d \le 0.1$.

However, the composition may differ depending on the state of holding ions, and a is a value in the state in which the ions in the second electrode layer are depleted. Specific examples of the lithium-containing composite oxides having a spinel type crystal structure include $LiMn_2O_4$.

Further, as the lithium-containing phosphoric acid compounds having an olivine type crystal structure, the compounds represented by the formula (F) may be mentioned as examples.

$$Li_aM^{15}PO_4 \qquad (F)$$

Here, $M^{15}$ is at least one kind of an element selected from the group consisting of cobalt <Co>, manganese <Mn>, iron <Fe>, nickel <Ni>, magnesium <Mg>, aluminum <Al>, boron <B>, titanium <Ti>, vanadium <V>, niobium <Nb>, copper <Cu>, zinc <Zn>, molybdenum <Mo>, calcium <Ca>, strontium <Sr>, tungsten <W>, and zirconium <Zr>, and the value of a satisfies:

$0.9 \le a \le 1.1$.

However, the composition may differ depending on the state of holding ions, and a is a value in the state in which the ions in the second electrode layer are depleted. Specific examples of the lithium-containing phosphoric acid compounds having an olivine type crystal structure include $LiFePO_4$, $LiMnPO_4$, $LiFe_{0.5}Mn_{0.5}PO_4$, and $LiFe_{0.3}Mn_{0.7}PO_4$.

Alternatively, as the lithium-containing composite oxides, the compounds represented by the formula (G) may be mentioned as examples.

$$(Li_2MnO_3)_x(LiMnO_2)_{1-x} \qquad (G)$$

Here, the value of x satisfies:
$0 \le x \le 1$.

However, the composition may differ depending on the state of holding ions, and x is a value in the state in which the ions in the second electrode layer are depleted.

Alternatively, examples of the metal sulfide or metal oxide that does not contain lithium include $TiS_2$, $MoS_2$, $NbSe_2$, and $V_2O_5$.

Besides these, the second electrode layer and the like may contain, for example, oxides such as titanium oxide, vanadium oxide, and manganese dioxide; disulfides such as titanium disulfide and molybdenum sulfide; chalcogenides such as niobium selenide; sulfur, and electroconductive polymers such as polyaniline and polythiophene.

Specific examples of the binder in the first electrode layer and the second electrode layer include polymer materials such as synthetic rubbers such as styrene butadiene rubber, fluorine-containing rubber, and ethylene propylene diene; and fluororesins such as polyvinylidene fluoride, polyvinyl fluoride, polyimide, and polytetrafluoroethylene, and low-melting-point glass.

The present technology is described below in further detail according to an embodiment.

[A01] <<Current Blocking Element>>
A current blocking element comprising:
a first electrode layer being capable of holding ions as they are, or in a reduced state, or in an oxidized state;
an ion conductive layer having ionic conductivity and not having electronic conductivity; and
a second electrode layer being capable of holding ions as they are, or in a reduced state, or in an oxidized state,
the first electrode layer, the ion conductive layer, and the second electrode layer being laminated in this order,
wherein, as current is let to flow between the first electrode layer and the second electrode layer, ions held in one of the electrode layers are moved to other one of the electrode layers; and
when ions held in one of the electrode layers are depleted or ions held in other one of the electrode layers are saturated, current flow between the first electrode layer and the second electrode layer is blocked.

[A02]
The current blocking element according to [A01], wherein the ion conductive layer includes a solid layer.

[A03]
The current blocking element according to [A01] or [A02], wherein
the ions are lithium ions;
the first electrode layer contains at least one kind of a substance selected from the group consisting of metal lithium, a carbon compound, a tin compound, and lithium titanate;
the second electrode layer contains at least one kind of a substance selected from the group consisting of lithium cobaltate, lithium manganate, and lithium iron phosphate; and
the ion conductive layer includes a solid electrolyte layer having lithium ion conductivity.

[A04]
The current blocking element according to [A01] or [A02], wherein
the ions are fluoride ions;
the first electrode layer contains a metal fluoride;
the second electrode layer contains a metal fluoride; and
the ion conductive layer includes a solid electrolyte layer having fluoride ion conductivity.

[A05]
The current blocking element according to any one of [A01] to [A04], wherein
the first electrode layer is connected to one terminal of a current copy-side circuit constituting a current mirror circuit or a current proportional circuit, and
the second electrode layer is connected to another terminal of the current copy-side circuit constituting the current mirror circuit or the current proportional circuit.

[A06]
The current blocking element according to any one of [A01] to [A05], further comprising a diode for blocking the current flowing in a direction reverse to that of the current flowing between the first electrode layer and the second electrode layer.

[B01] <<Current Blocking Element Assembly>>
A current blocking element assembly comprising a first current blocking element and a second current blocking element,
the first current blocking element comprising:
a first-A electrode layer being capable of holding ions as they are, or in a reduced state, or in an oxidized state;
an ion conductive layer that conducts ions and does not have electronic conductivity; and a second-A electrode layer being capable of holding ions as they are, or in a reduced state, or in an oxidized state, the first-A electrode layer, the ion conductive layer, and the second-A electrode layer being laminated in this order, the second current blocking element comprising:

a first-B electrode layer being capable of holding ions as they are, or in a reduced state, or in an oxidized state;

an ion conductive layer that conducts ions and does not have electronic conductivity; and a second-B electrode layer being capable of holding ions as they are, or in a reduced state, or in an oxidized state, the first-B electrode layer, the ion conductive layer, and the second-B electrode layer being laminated in this order, wherein the second-A electrode layer and the second-B electrode layer are electrically connected;

as current is let to flow between the first-A electrode layer and the first-B electrode layer, ions held in one of the electrode layers constituting the first current blocking element are moved to other one of the electrode layers constituting the first current blocking element; and when ions held in one of the electrode layers constituting the first current blocking element are depleted or ions held in other one of the electrode layers constituting the first current blocking element are saturated, current flow between the first-A electrode layer and the second-A electrode layer is blocked.

[B02]

The current blocking element assembly according to [B01], wherein the first-A electrode layer is connected to one terminal of a current copy-side circuit constituting a current mirror circuit or a current proportional circuit, and the first-B electrode layer is connected to another terminal of the current copy-side circuit constituting the current mirror circuit or the current proportional circuit.

[B03]

The current blocking element assembly according to [B01] or [B02], wherein the ions are lithium ions;

the first-A electrode layer and the first-B electrode layer contain at least one kind of a substance selected from the group consisting of metal lithium, a carbon compound, a tin compound, and lithium titanate;

the second-A electrode layer and the second-B electrode layer contain at least one kind of a substance selected from the group consisting of lithium cobaltate, lithium manganate, and lithium iron phosphate; and the ion conductive layers constituting the first current blocking element and the second current blocking element include a solid electrolyte layer having lithium ion conductivity.

[B04]

The current blocking element assembly according to [B01] or [B02], wherein the ions are fluoride ions;

the first-A electrode layer and the first-B electrode layer contain a fluoride;

the second-A electrode layer and the second-B electrode layer contain a fluoride; and the ion conductive layers constituting the first current blocking element and the second current blocking element include a solid electrolyte layer having fluoride ion conductivity.

[C01]<<Product Having Current Blocking Element Mounted Thereon>>

A product having a current blocking element mounted thereon, the current blocking element comprising:

a first electrode layer being capable of holding ions as they are, or in a reduced state, or in an oxidized state;

an ion conductive layer having ionic conductivity and not having electronic conductivity; and a second electrode layer being capable of holding ions as they are, or in a reduced state, or in an oxidized state, the first electrode layer, the ion conductive layer, and the second electrode layer being laminated in this order, wherein, as current is let to flow between the first electrode layer and the second electrode layer based on a current in the product, ions held in one of the electrode layers are moved to other one of the electrode layers; and when ions held in one of the electrode layers are depleted or ions held in other one of the electrode layers are saturated, current flow in the product is blocked.

[C02]

The product having the current blocking element mounted thereon according to [C01], wherein a current mirror circuit or a current proportional circuit is further provided;

a current reference-side circuit constituting the current mirror circuit or the current proportional circuit is incorporated in the product;

the first electrode layer is connected to one terminal of a current copy-side circuit constituting the current mirror circuit or the current proportional circuit, and the second electrode layer is connected to another terminal of the current copy-side circuit constituting the current mirror circuit or the current proportional circuit.

[C03]

The product having the current blocking element mounted thereon according to [C01] or [C02], further comprising a diode for blocking the current flowing in a direction reverse to that of the current flowing between the first electrode layer and the second electrode layer.

[C04]

The product having the current blocking element mounted thereon according to any one of [C01] to [C03], wherein the ion conductive layer includes a solid layer.

[C05]

The product having the current blocking element mounted thereon according to any one of [C01] to [C04], wherein the ions are lithium ions;

the first electrode layer contains at least one kind of a substance selected from the group consisting of metal lithium, a carbon compound, a tin compound, and lithium titanate;

the second electrode layer contains at least one kind of a substance selected from the group consisting of lithium cobaltate, lithium manganate, and lithium iron phosphate; and the ion conductive layer includes a solid electrolyte layer having lithium ion conductivity.

[C06]

The product having the current blocking element mounted thereon according to any one of [C01] to [C04], wherein the ions are fluoride ions;

the first electrode layer contains a metal fluoride;

the second electrode layer contains a metal fluoride; and the ion conductive layer includes a solid electrolyte layer having fluoride ion conductivity.

[D01] <<Product Having Current Blocking Element Assembly Mounted Thereon>>

A product having a current blocking element assembly mounted thereon, the current blocking element assembly comprising a first current blocking element and a second current blocking element, the first current blocking element comprising:
a first-A electrode layer being capable of holding ions as they are, or in a reduced state, or in an oxidized state;
an ion conductive layer that conducts ions and does not have electronic conductivity; and
a second-A electrode layer being capable of holding ions as they are, or in a reduced state, or in an oxidized state,
the first-A electrode layer, the ion conductive layer, and the second-A electrode layer being laminated in this order, the second current blocking element comprising:
a first-B electrode layer being capable of holding ions as they are, or in a reduced state, or in an oxidized state;
an ion conductive layer that conducts ions and does not have electronic conductivity; and
a second-B electrode layer being capable of holding ions as they are, or in a reduced state, or in an oxidized state,
the first-B electrode layer, the ion conductive layer, and the second-B electrode layer being laminated in this order, the second-A electrode layer and the second-B electrode layer being electrically connected, wherein, as current is let to flow between the first-A electrode layer and the first-B electrode layer based on a current in the product, ions held in one of the electrode layers constituting the first current blocking element are moved to other one of the electrode layers constituting the first current blocking element; and, when ions held in one of the electrode layers constituting the first current blocking element are depleted or ions held in other one of the electrode layers constituting the first current blocking element are saturated, current flow in the product is blocked.

[D02]
The product having the current blocking element assembly mounted thereon according to [D01],
wherein a current mirror circuit or a current proportional circuit is further provided;
a current reference-side circuit constituting the current mirror circuit or the current proportional circuit is incorporated in the product;
the first-A electrode layer is connected to one terminal of a current copy-side circuit constituting the current mirror circuit or the current proportional circuit, and
the first-B electrode layer is connected to another terminal of the current copy-side circuit constituting the current mirror circuit or the current proportional circuit.

[D03]
The product having the current blocking element assembly mounted thereon according to [D01] or [D02], wherein
the ions are lithium ions;
the first-A electrode layer and the first-B electrode layer contain at least one kind of a substance selected from the group consisting of metal lithium, a carbon compound, a tin compound, and lithium titanate;
the second-A electrode layer and the second-B electrode layer contain at least one kind of a substance selected from the group consisting of lithium cobaltate, lithium manganate, and lithium iron phosphate; and
the ion conductive layers constituting the first current blocking element and the second current blocking element include a solid electrolyte layer having lithium ion conductivity.

[D04]
The product having the current blocking element assembly mounted thereon according to [D01] or [D02], wherein
the ions are fluoride ions;
the first-A electrode layer and the first-B electrode layer contain a fluoride;
the second-A electrode layer and the second-B electrode layer contain a fluoride; and
the ion conductive layers constituting the first current blocking element and the second current blocking element include a solid electrolyte layer having fluoride ion conductivity.

[E01] <<Current Controlling Method: First Mode>>
A current controlling method in a product having a current blocking element mounted thereon, the current blocking element comprising:
a first electrode layer being capable of holding ions as they are, or in a reduced state, or in an oxidized state;
an ion conductive layer having ionic conductivity and not having electronic conductivity; and
a second electrode layer being capable of holding ions as they are, or in a reduced state, or in an oxidized state,
the first electrode layer, the ion conductive layer, and the second electrode layer being laminated in this order,
wherein, as current is let to flow between the first electrode layer and the second electrode layer based on a current in the product, ions held in one of the electrode layers are moved to other one of the electrode layers; and
when ions held in one of the electrode layers are depleted or ions held in other one of the electrode layers are saturated, current flow in the product is blocked.

[E02] <<Current Controlling Method: Second Mode>>
A current controlling method in a product having a current blocking element assembly mounted thereon, the current blocking element assembly comprising a first current blocking element and a second current blocking element, the first current blocking element comprising:
a first-A electrode layer being capable of holding ions as they are, or in a reduced state, or in an oxidized state;
an ion conductive layer that conducts ions and does not have electronic conductivity; and
a second-A electrode layer being capable of holding ions as they are, or in a reduced state, or in an oxidized state,
the first-A electrode layer, the ion conductive layer, and the second-A electrode layer being laminated in this order, the second current blocking element comprising:
a first-B electrode layer being capable of holding ions as they are, or in a reduced state, or in an oxidized state;
an ion conductive layer that conducts ions and does not have electronic conductivity; and
a second-B electrode layer being capable of holding ions as they are, or in a reduced state, or in an oxidized state,
the first-B electrode layer, the ion conductive layer, and the second-B electrode layer being laminated in this order, the second-A electrode layer and the second-B electrode layer being electrically connected, wherein, as current is let to flow between the first-A electrode layer and the first-B electrode layer based on a current in the product, ions held in one of the electrode layers constituting the first current blocking element are moved to other one of the electrode layers constituting the first current blocking element; and, when ions held in one of the electrode layers constituting the first current blocking element are depleted or ions held in other one of the electrode layers constituting the first current blocking element are saturated, current flow in the product is blocked.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A current blocking element assembly comprising a first current blocking element and a second current blocking element,
the first current blocking element comprising:
a first-A electrode layer configured to hold ions;
a first ion conductive layer that is configured to conduct ions and does not have electronic conductivity; and
a second-A electrode layer configured to hold ions,
the first-A electrode layer, the first ion conductive layer, and the second-A electrode layer being laminated in this order,
the second current blocking element comprising:
a first-B electrode layer configured to hold ions;
a second ion conductive layer that is configured to conduct ions and does not have electronic conductivity; and
a second-B electrode layer configured to hold ions,
the first-B electrode layer, the second ion conductive layer, and the second-B electrode layer being laminated in this order,
wherein the second-A electrode layer and the second-B electrode layer are electrically connected;
wherein ions held in one of the electrode layers of the first current blocking element are moved to the other one of the electrode layers of the first current blocking element when current is configured to flow between the first-A electrode layer and the first-B electrode layer; and
wherein current flow between the first-A electrode layer and the second-A electrode layer is blocked when ions held in one of the first-A and second-A electrode layers of the first current blocking element are depleted or saturated.

2. The current blocking element assembly according to claim 1, wherein
the first-A electrode layer is connected to a first terminal of a current copy-side circuit of a current mirror circuit or a current proportional circuit, and
the first-B electrode layer is connected to a second terminal of the current copy-side circuit of the current mirror circuit or the current proportional circuit.

3. The current blocking element assembly according to claim 1, wherein
the ions include lithium ions;
the first-A electrode layer and the first-B electrode layer include at least a substance selected from the group consisting of metal lithium, a carbon compound, a tin compound, lithium titanate, and combinations thereof;
the second-A electrode layer and the second-B electrode layer include at least a substance selected from the group consisting of lithium cobaltate, lithium manganate, lithium iron phosphate, and combinations thereof; and
the first and second ion conductive layers include a solid electrolyte layer having lithium ion conductivity.

4. The current blocking element assembly according to claim 1, wherein
the ions include fluoride ions;
the first-A electrode layer and the first-B electrode layer include a fluoride;
the second-A electrode layer and the second-B electrode layer include a fluoride; and
the first and second ion conductive layers include a solid electrolyte layer having fluoride ion conductivity.

5. A product having a current blocking element assembly according to claim 1.

6. The product having the current blocking element assembly mounted thereon according to claim 5,
wherein a current mirror circuit or a current proportional circuit is further provided;
a current reference-side circuit of the current mirror circuit or the current proportional circuit is incorporated in the product;
the first-A electrode layer is connected to a first terminal of a current copy-side circuit of the current mirror circuit or the current proportional circuit, and
the first-B electrode layer is connected to a second terminal of the current copy-side circuit of the current mirror circuit or the current proportional circuit.

7. A current controlling method in a product having a current blocking element assembly according claim 1.

* * * * *